(12) United States Patent
Seki et al.

(10) Patent No.: US 9,085,828 B2
(45) Date of Patent: *Jul. 21, 2015

(54) ELECTROFORMING METHOD

(75) Inventors: Kazumasa Seki, Kusatsu (JP); Akihiko Hatamura, Uji (JP); Hitoshi Yoshida, Otsu (JP); Toshio Yamashita, Moriyama (JP); Yasuhiro Miura, Kyoto (JP)

(73) Assignee: OMRON Corporation, Kyoto (JP)

( * ) Notice: Subject to any disclaimer, the term of this patent is extended or adjusted under 35 U.S.C. 154(b) by 597 days.

This patent is subject to a terminal disclaimer.

(21) Appl. No.: 13/063,638

(22) PCT Filed: Sep. 11, 2009

(86) PCT No.: PCT/JP2009/004522
§ 371 (c)(1),
(2), (4) Date: Jun. 6, 2011

(87) PCT Pub. No.: WO2010/035417
PCT Pub. Date: Apr. 1, 2010

(65) Prior Publication Data
US 2011/0233063 A1     Sep. 29, 2011

(30) Foreign Application Priority Data
Sep. 29, 2008   (JP) .................................. 2008-251085

(51) Int. Cl.
*C25D 5/02* (2006.01)
*C25D 1/10* (2006.01)
(Continued)

(52) U.S. Cl.
CPC ............... *C25D 5/022* (2013.01); *C25D 1/003* (2013.01); *C25D 1/10* (2013.01); *C25D 1/20* (2013.01); *H05K 3/205* (2013.01)

(58) Field of Classification Search
CPC .................................... C25D 1/10; C25D 1/20

USPC .................................. 205/67, 70, 78, 95, 112
See application file for complete search history.

(56) References Cited

U.S. PATENT DOCUMENTS

| 5,647,966 A | * | 7/1997 | Uriu et al. | ........................ 205/78 |
| 6,933,738 B2 | * | 8/2005 | Martin et al. | ............ 324/750.25 |
| 2006/0237856 A1 | * | 10/2006 | Eldridge et al. | ............... 257/784 |

FOREIGN PATENT DOCUMENTS

| JP | H03-163857 A | 7/1991 |
| JP | 04-183892 A | 6/1992 |

(Continued)

OTHER PUBLICATIONS

Patent Abstracts of Japan, Publication No. 8-225983, dated Sep. 3, 1996, 1 page.

(Continued)

*Primary Examiner* — Luan Van
*Assistant Examiner* — Louis Rufo
(74) *Attorney, Agent, or Firm* — Osha Liang LLP

(57) ABSTRACT

A mold is fabricated with a cavity formed in an insulating layer formed so as to be placed on an upper surface of a conductive base material. This mold is disposed in an electrolyte bath to be applied with a voltage, and a metal is electrodeposited on the bottom surface of the cavity to electroform a metal-formed product in the cavity. In this electrodepositing process, when the width of the cavity is taken as W and a vertical height of a head space between an upper opening of the cavity and an upper surface of a metal layer is taken as H, the growth of the metal layer is stopped so that the height H of the head space left above the metal layer satisfies: where 300 µm≤W; H≥W/3.75 where 200 µm≤W<300 µm; H≥W/4 where 100 µm≤W<200 µm; and H≥W/10 where W<100 µm.

20 Claims, 28 Drawing Sheets

(51) Int. Cl.
*C25D 1/20* (2006.01)
*C25D 1/00* (2006.01)
*H05K 3/20* (2006.01)

(56) References Cited

FOREIGN PATENT DOCUMENTS

| JP | H05-259359 A | 10/1993 |
| JP | 08-064145 A | 3/1996 |
| JP | 08-138941 A | 5/1996 |
| JP | 8-225983 A | 9/1996 |
| JP | 2001-205599 A | 7/2001 |

OTHER PUBLICATIONS

International Search Report issued in PCT/JP2009/004522, mailed on Dec. 28, 2009, with translation, 4 pages.
Written Opinion issued in PCT/JP2009/004522, mailed on Dec. 28, 2009, 3 pages.
Office Action issued in corresponding Japanese Application No. 2008-251085 dated Jul. 23, 2013, and English translation thereof (5 pages).

* cited by examiner

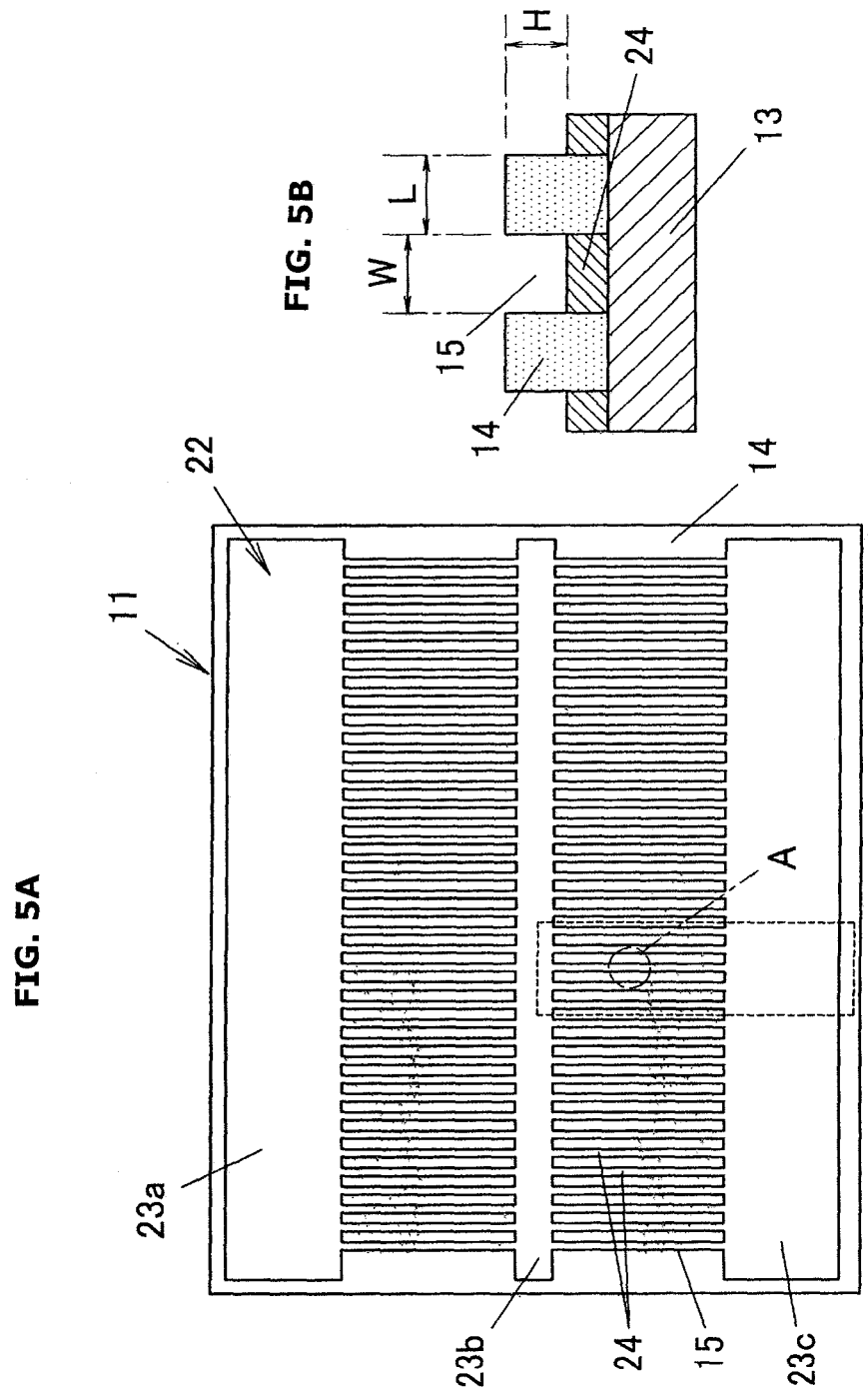

ELECTROFORMING METHOD

BACKGROUND OF INVENTION

1. Technical Field

One or more embodiments of the present invention relate to an electroforming method for molding metal products.

2. Background Art

As a method of manufacturing a fine metal product that is difficult to produce with machining, electroforming technology (electroforming) has been known. This is a thick electroplating process of thickly plating a metal on a mold and removing the thick-plated film (the metal-formed product) from the mold, thereby forming a metal product. In general, electroplating with a thickness exceeding 20 μm is called electroforming.

For example, in a method disclosed in Patent Document 1, the surface of a metal-made mold is coated with a photoresist, and is then patterned to form a resist film with an opening of a desired pattern, and then a metal is electrodeposited inside the opening of the resist film, that is, on a part of the surface of the mold not coated with the resist film to form a metal layer (a thick-plated film). Then, the metal layer is removed from the mold, thereby obtaining a fine metal-formed product of a desired shape.

However, in the process of electrodepositing a metal on the surface of the mold, part of an electric current interrupted by the resist film flows into an electrodeposited part near the resist film to partially increase the amount of electrodeposition, resulting in a trouble of unevenness of the thickness of the metal layer. In particular, the metal layer bulges at its edge portion of a surface of the metal layer (a surface opposite to the surface electrodeposited on the mold) in contact with the resist film, thereby causing the thickness of the metal layer to partially increase.

For this reason, in the method disclosed in Patent Document 1, the metal layer is formed so as to be slightly thicker than the resist film, and the surface of the metal layer is then polished to be smoothed, thereby making the thickness of the metal layer uniform.

As described above, in conventional electroforming, the surface of the metal layer (a surface opposite to a surface electrodeposited on a mold) cannot be controlled, which considerably restricts the moldable shape of a metal-formed product. Also, in order to put the shape of the metal-formed product properly, polishing or the like has to be performed after forming, which decreases efficiency of manufacture and increases cost of manufacture.

Patent Document

Patent Document 1: Japanese Unexamined Patent Application Publication No. 8-225983 (paragraph 0002, FIG. 7)

SUMMARY OF INVENTION

One or more embodiments of the present invention have been devised to provide an electroforming method capable of controlling the shape of a metal layer surface opposite to a surface electrodeposited on a mold.

A first electroforming method according to one or more embodiments of the present invention includes: a mold forming step of forming an insulating layer so that the insulating layer is placed on an upper surface of a conductive base material, providing a recessed part in the insulating layer, and forming a mold with the conductive base material exposed from at least part of a bottom surface of the recessed part; and an electrodepositing step of applying a voltage to the mold disposed in an electrolytic bath and electrodepositing a metal on an exposed surface of the conductive base material inside the recessed part, wherein in the electrodepositing step, when the recessed part has a width equal to or longer than 300 μm, a metal layer is let grow inside the recessed part so that a space with a height 1/2.85 times as long as the width of the recessed part or longer is left.

Also, a second electroforming method according to one or more embodiments of the present invention includes: a mold forming step of forming an insulating layer so that the insulating layer is placed on an upper surface of a conductive base material, providing a recessed part in the insulating layer, and forming a mold with the conductive base material exposed from at least part of a bottom surface of the recessed part; and an electrodepositing step of applying a voltage to the mold disposed in an electrolytic bath and electrodepositing a metal on an exposed surface of the conductive base material inside the recessed part, wherein in the electrodepositing step, when the recessed part has a width equal to or longer than 200 μm and shorter than 300 μm, a metal layer is let grow inside the recessed part so that a space with a height 1/3.75 times as long as the width of the recessed part or longer is left.

Furthermore, a third electroforming method according to one or more embodiments of the present invention includes: a mold forming step of forming an insulating layer so that the insulating layer is placed on an upper surface of a conductive base material, providing a recessed part in the insulating layer, and forming a mold with the conductive base material exposed from at least part of a bottom surface of the recessed part; and an electrodepositing step of applying a voltage to the mold disposed in an electrolytic bath and electrodepositing a metal on an exposed surface of the conductive base material inside the recessed part, wherein in the electrodepositing step, when the recessed part has a width equal to or longer than 100 μm and shorter than 200 μm, a metal layer is let grow inside the recessed part so that a space with a height 1/4 times as long as the width of the recessed part or longer is left.

Still further, a fourth electroforming method according to one or more embodiments of the present invention includes: a mold forming step of forming an insulating layer so that the insulating layer is placed on an upper surface of a conductive base material, providing a recessed part in the insulating layer, and forming a mold with the conductive base material exposed from at least part of a bottom surface of the recessed part; and an electrodepositing step of applying a voltage to the mold disposed in an electrolytic bath and electrodepositing a metal on an exposed surface of the conductive base material inside the recessed part, wherein in the electrodepositing step, when the recessed part has a width shorter than 100 μm, a metal layer is let grow inside the recessed part so that a space with a height 1/10 times as long as the width of the recessed part or longer is left.

Here, the conductive base material is a base material for deposition of a metal layer by electroforming. The conductive base material may have a surface in a flat shape or provided with asperities or a step. Used as an electrode in electroforming, the conductive base material has to have conductivity, but is not restricted to be entirely made of a conductive material. A conductive coat part made of a conductive material may be provided to an entire or part of a surface of a core material made of a non-conductive material. Also, an insulating coat part may be provided to part of a surface of a core material made of a conductive material.

The insulating layer is a layer electrically insulating the surface of the conductive base material at the time of electroforming to suppress metal electrodeposition. In general, a resist is used as an insulating layer. Also, the mold is a master electrode made of a conductive base material and an insulating layer with one or plurality of recessed parts for formation formed thereon. Electrodeposition is deposition, on one electrode (mold) disposed in an electrolytic bath, of a metal deposit proportional to a total amount of passage of an electric current.

The recessed part is a cavity formed with an insulating layer on the upper surface of the conductive base material, and has a reversed shape of a metal-formed product to be fabricated. The width of the recessed part is an opening width at a position where the width is to be defined, the opening width obtained by measuring a cross section of the recessed part in an narrowest-width direction at a height where the growth of the metal layer is to be stopped. The height of the space to be left inside the recessed part is a vertical distance from a top end of the metal layer deposited inside the recessed part to the upper surface of the insulating layer (the upper opening of the recessed part). However, when the height of the insulating layer is not uniform, the height of the space to be left inside the recessed part is a vertical distance from the top end of the metal layer to an upper surface of the insulating layer at a lowest position of the height of the insulating layer.

Thus, in the first to fourth electroforming methods according to one or more embodiments of the present invention, the growth of the metal layer is stopped with a predetermined space left above the metal layer without electroforming a metal in the entire inner space of the recessed part. With this, a portion of the insulating layer at an edge of the upper opening of the recessed part interrupts an electric current flowing in a slanting direction from a portion of the counter electrode not facing the recessed part to the metal layer already deposited. Therefore, the thickness of the metal to be electrodeposited is not varied. For this reason, the metal layer to be electroformed uniformly grows so that a distance from a portion where the insulating layer of the mold is not formed is constant.

Also, in the first to fourth electroforming methods according to one or more embodiments of the present invention, a minimum value of the space to be left above the metal layer (that is, a maximum value of the thickness of the metal layer with respect to a thickness of the insulating layer) is defined according to the width of the recessed part. Therefore, a metal-formed product can be efficiently formed with a minimum thickness of the insulating layer (that is, the material of the insulating layer can be saved) determined with the width of the recessed part and the thickness of the metal-formed product to be formed.

In an embodiment of the first to fourth electroforming methods according to one or more embodiments of the present invention, in the mold forming step, the insulating layer may be formed at at least part of a circumferential edge of the bottom surface of the recessed part. The metal layer grows so that the distance from a portion where the insulating layer of the mold is not formed is constant. Thus, according to this embodiment, the metal layer can be formed so that a curved surface is formed on an upper portion of the insulating layer of an outer perimeter of the bottom surface. With this, for example, an edge opposite to the mold of the metal-formed product can be chamfered.

In another embodiment of the first to fourth electroforming methods according to one or more embodiments of the present invention, a recess may be formed in the upper surface of the conductive base material in a region overlapping the bottom surface of the recessed part. According to this embodiment, with the recess of the conductive base material, the bottom surface of the recessed part can take various shapes, and therefore metal-formed products of various shapes can be formed.

In still another embodiment of the first to fourth electroforming methods according to one or more embodiments of the present invention, a surface of the conductive base material exposed from the bottom surface of the recessed part may be a set configured of mainly a plane at an angle of inclination equal to or smaller than 60 degrees with respect to a plane perpendicular to a voltage applying direction. In this embodiment, the surface where the insulating layer of the mold is not formed is not inclined at a degree larger than 60 degrees from the plane perpendicular to the voltage applying direction in a space defined with the counter electrode, thereby preventing the inclined surface from drawing the electric current from the counter electrode in a slanting direction to let the metal layer grow unevenly. However, even if the surface has an angle of inclination larger than 60 degrees from the plane perpendicular to the voltage applying direction, unevenness tends not to occur if the surface has an area smaller than the area of the entire bottom surface of the recessed part.

In still another embodiment of the first to fourth electroforming methods according to one or more embodiments of the present invention, in the mold forming step, a step part may be formed on a side wall surface of the recessed part to expand an opening area of the recessed part. According to this embodiment, part of the metal-formed product can be formed so as to protrude in a direction different from the voltage applying direction.

In still another embodiment of the first to fourth electroforming methods according to one or more embodiments of the present invention, in the electrodepositing step, the voltage may be stopped when a total amount of passage of an electric current flowing through the electrolytic bath reaches a predetermined value. The total amount of the metal to be electrodeposited is proportional to the total amount of passage of the electric current flowing through the electrolytic bath. Therefore, the thickness of the grown metal layer can be controlled without direct measurement.

Note that one or more embodiments of the present invention have features obtained by combining the components described in the foregoing as appropriate, and the one or more embodiments of the present invention may have a large variety of combinations of these components.

According to one or more embodiments of the present invention, the growth of the metal layer is stopped, with a space left above the metal layer with a height according to the width of the recessed part. Therefore, an electric current flows from the side of the metal layer to make the thickness of the formed metal layer uniform in a growing direction, and no finish is required to be performed on the surface opposite to the mold.

BRIEF DESCRIPTION OF THE DRAWINGS

FIG. 5A is a plan view of the shape of a sample used for defining a relation between the width of a cavity and the height of a head space according to one or more embodiments of the present invention.

FIG. 5B is an enlarged view of a cross section of an A part of FIG. 5A according to one or more embodiments of the present invention.

DETAILED DESCRIPTION

One or more embodiments of the present invention are described with reference to the attached drawings. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

First Embodiment

Figure 1:
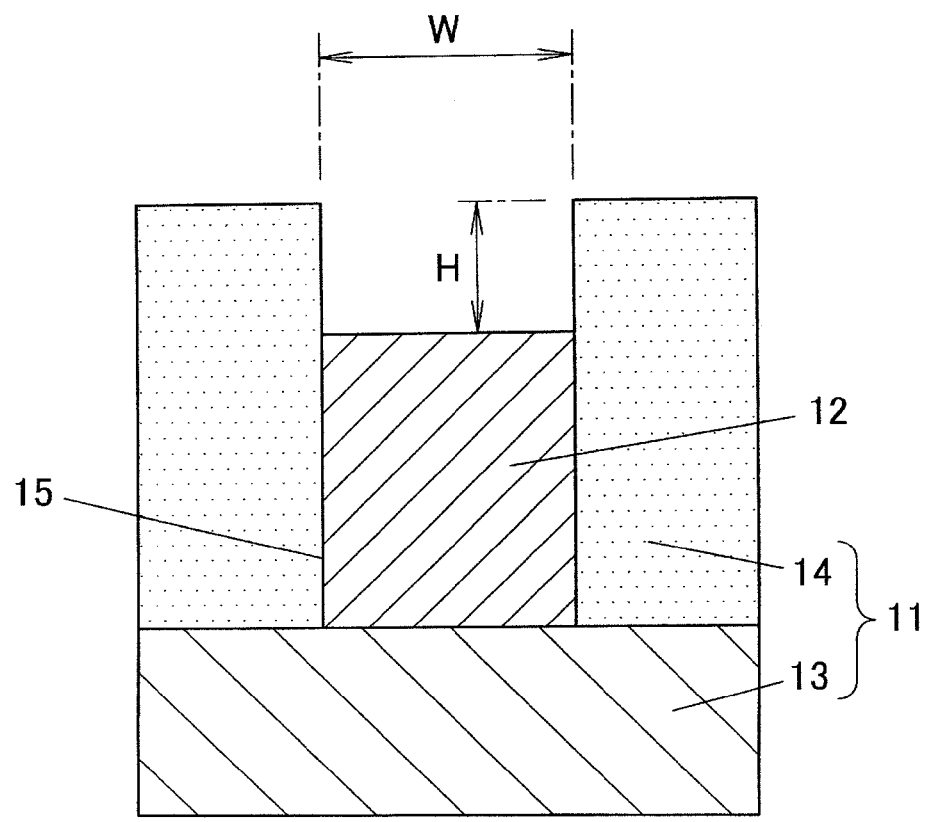
FIG. 1 is a sectional view of a mold for use in an electroforming method according to a first embodiment of the present invention.

FIG. 1 is a sectional view for describing an electroforming method (hereinafter referred to electroforming) according to a first embodiment of the present invention, depicting a mold 11 and a metal-formed product 12 electroformed by using the mold 11.

The mold 11 for use in the first embodiment is produced by laminating a thick insulating layer 14 on a flat upper surface of a conductive base material 13. In the insulating layer 14, a cavity 15 (a recessed part) in a reversed shape of the metal-formed product 12 is formed. On the bottom surface of the cavity 15, no insulating layer 14 is left, and an upper surface of the conductive base material 13 is exposed from the entire bottom surface of the cavity 15. In the cavity 15 of the mold 11, the metal-formed product 12 is formed by electroforming. Note that FIG. 1 depicts a cross section of the cavity 15 in a direction (a transverse direction) orthogonal to a longitudinal direction.

Next, a process of fabricating the metal-formed product 12 by using the mold 11 as described above is described. FIGS. 2A to 2J depict a process of forming the metal-formed product 12 by electroforming. FIGS. 2A to 2F depict a process of forming the mold 11 (a mold forming process), FIGS. 2G and 2H depict a process of fabricating the metal-formed product 12 by electrodepositing a metal inside the cavity 15 (an electrodepositing process), and FIGS. 2I and 2J depict a process of removing the metal-formed product 12 from the mold 11 (a removing process). Note that while, in practice, a plurality of cavities are formed in the mold 11 to fabricate a plurality of metal-formed products 12 at a time, the case of fabricating one metal-formed product 12 is described for the sake of convenience.

Figure 2A:
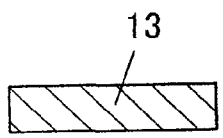
FIGS. 2A-2J are schematic sectional views depicting a process of forming a metal-formed product by electroforming of the first embodiment.
Figure 2B:
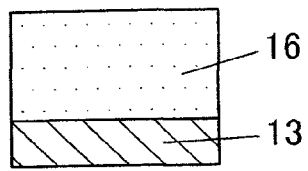
Figure 2C:
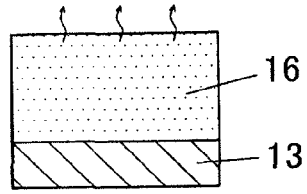
Figure 2D:
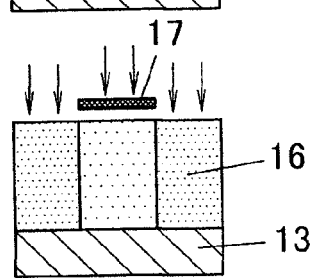
Figure 2E:
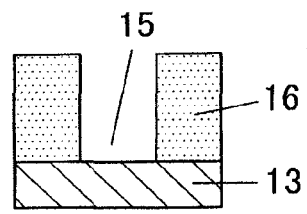
Figure 2F:
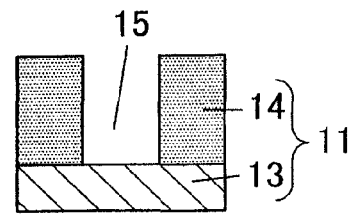
Figure 2G:
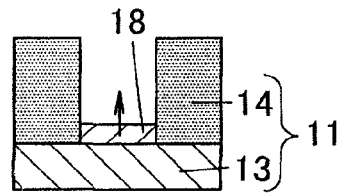
Figure 2H:
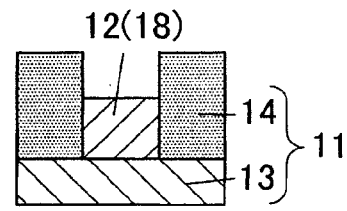
Figure 2I:
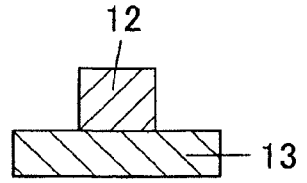
Figure 2J:
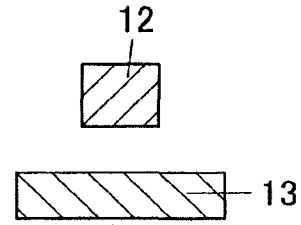

FIG. 2A depicts the metal-made conductive base material 13 having a flat upper surface, at least of which has been subjected to a process for allowing the electrodeposited metal-formed product 12 to be easily removed therefrom. In the mold forming process, as depicted in FIG. 2B, the upper surface of the conductive base material 13 is first coated with a negative-type photoresist 16 by a spray coater or a spin coater to form a thick film having a uniform thickness. Next, as depicted in FIG. 2C, the photoresist 16 is pre-baked and then, as depicted in FIG. 2D, a photoresist 16 is exposed to light, with a region where the cavity 15 is to be formed being covered with a mask 17. Because the region of the photoresist 16 exposed to light is not dissolved at the time of development because the region becomes insolubilized, only the region covered with the mask 17 is dissolved and removed due to development, and the cavity 15 is formed in the photoresist 16 as depicted in FIG. 2E. Finally, by post-baking the photoresist 16, the insulating layer 14 having a predetermined thickness is formed on the upper surface of the conductive base material 13. Thus obtained mold 11 is depicted in FIG. 2F.

Note that while only the upper surface of the conductive base material 13 is covered with the insulating layer 14 in FIG. 1 and FIGS. 2A to 2J, in practice, the lower and side surfaces and others of the conductive base material 13 are also covered with an insulating layer so that a metal is not electrodeposited on regions other than the inside of the cavity 15.

Figure 3:
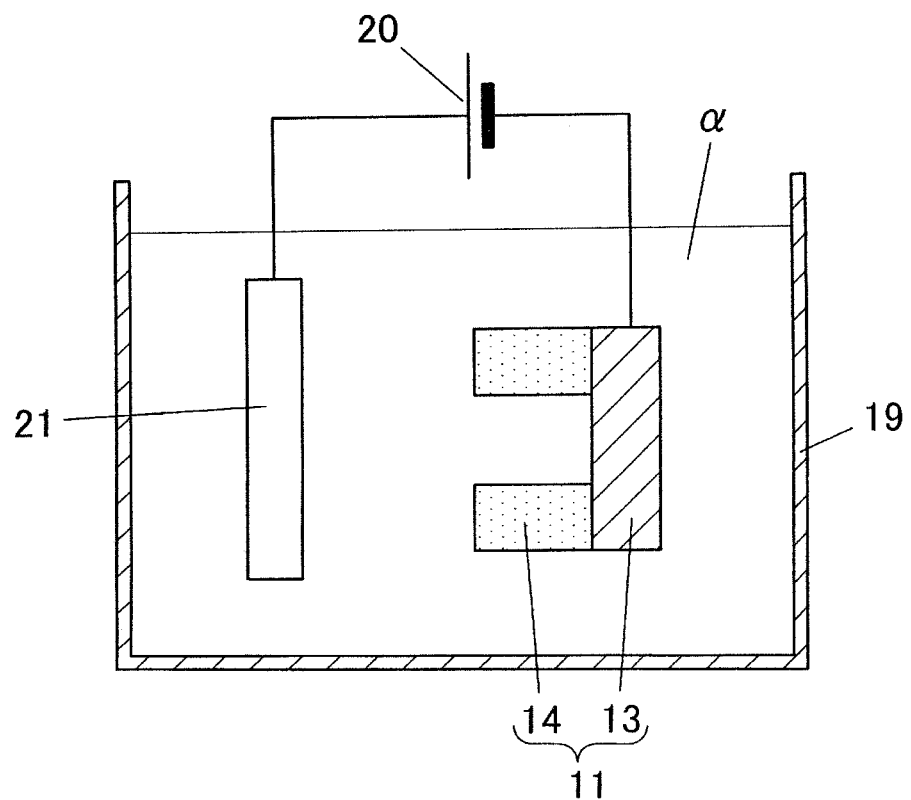
FIG. 3 is a sectional view of the mold disposed in an electrolytic bath according to one or more embodiments of the present invention.

In the electrodepositing process, as depicted in FIG. 3, the mold 11 is deposited in an electrolytic bath 19, and a voltage is applied between the mold 11 and a counter electrode 21 by a direct-current power supply 20 to let an electric current flow through an electrolytic solution α. When current passage starts, metal ions in the electrolytic solution α are electrodeposited on the surface of the conductive base material 13 to deposit a metal layer 18. On the other hand, because the insulating layer 14 interrupts an electric current, even when a voltage is applied between the mold 11 and the counter electrode 21, no metal is directly electrodeposited on the insulating layer 14. Therefore, as depicted in FIG. 2G, the metal layer 18 grows from the bottom surface inside the cavity 15 in a voltage applying direction.

Figure 4A:
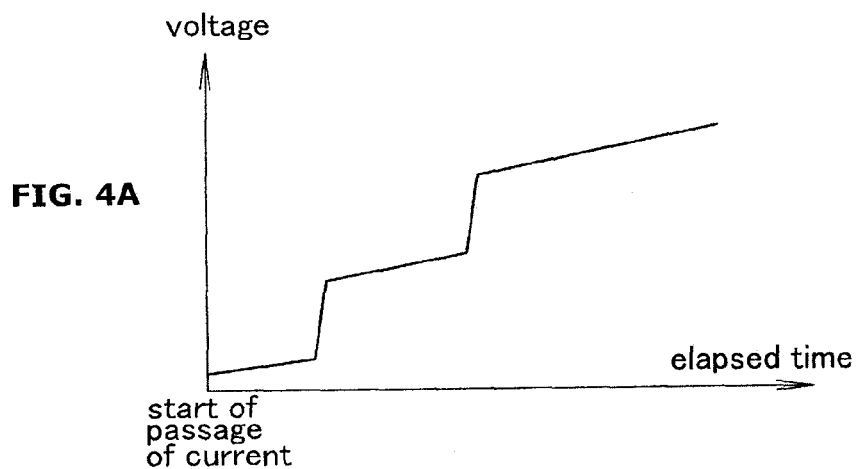
FIG. 4A is a drawing that shows changes of a voltage to be applied between electrodes of the electrolytic bath according to one or more embodiments of the present invention.
Figure 4B:
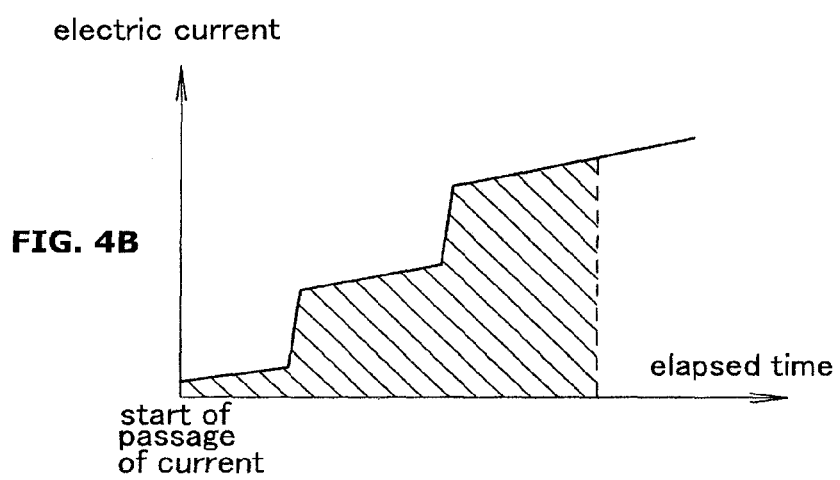
FIG. 4B is a drawing that shows changes of an electric current flowing through the electrolytic bath according to one or more embodiments of the present invention.

At this time, the electrodeposited metal layer 18 (the metal-formed product 12) has a thickness controlled with the total amount of passage of an electric current (that is, a total amount of time for the passing electric current, which corresponds to an area of a hatched region in FIG. 4B). The reason for this is as follows. That is, because the amount of metal deposited per unit time is proportional to the amount of electric current, the volume of the metal layer 18 is determined with the total amount of passage of the electric current, and the thickness of the metal layer 18 can be known from the total amount of passage of the electric current.

For example, as depicted in FIG. 4A, as the voltage of the direct-current power supply 20 gradually increases stepwise with time elapsed from the start of passage of the electric current, the electric current flowing between the counter electrode 21 and the mold 11 also gradually increases stepwise with time elapsed from the start of passage of the electric current, as depicted in FIG. 4B. Then, once it is detected by monitoring the total amount of passage of the electric current that the thickness of the metal layer 18 reaches a target, the direct-current power supply 20 is turned OFF to stop passage of the electric current. As a result, as depicted in FIG. 2H, the metal-formed product 12 is formed in the cavity 15 with the metal layer 18 having the predetermined thickness.

Also, in the electrodepositing process of letting the metal layer 18 (the metal-formed product 12) grow inside the cavity 15 when the cavity 15 has a width equal to or longer than 300 μm, the metal layer 18 is let grow so that a space with a height 1/2.85 times as long as the width of the cavity 15 (hereinafter referred to as a head space) or longer is left. Furthermore, when the width of the cavity 15 is equal to or longer than 200 μm and is shorter than 300 μm, the metal layer 18 is let grow so that a head space with a height 1/3.75 as long as the width of the cavity 15 or longer is left. Still further, when the width of the cavity 15 is equal to or longer than 100 μm and is shorter than 200 μm, the metal layer 18 is let grow so that a head space with a height 1/4 as long as the width of the cavity 15 or longer is left. Still further, when the width of the cavity 15 is shorter than 100 μm, the metal layer 18 is let grow so that a head space with a height 1/10 as long as the width of the recessed part or longer is left. That is, in one or more embodiments of the present invention, when the width of the cavity 15 is taken as W and a vertical height of the head space between the upper opening of the cavity 15 (that is, the upper surface of the insulating layer 14) and the upper surface of the metal layer 18 is taken as H, the growth of the metal layer 18 is stopped so that the height H of the head space to be left above the metal layer 18 satisfies:

$H \geq W/2.85$ where $300\ \mu m \leq W$;

$H \geq W/3.75$ where $200\ \mu m \leq W < 300\ \mu m$;

$H \geq W/4$ where $100\ \mu m \leq W < 200\ \mu m$; and $H \geq W/10$ where $W < 100\ \mu m$.

When the metal-formed product 12 is formed, the insulating layer 14 is removed by etching or the like, as depicted in FIG. 2I. Furthermore, as depicted in FIG. 2J, the metal-formed product 12 is removed from the conductive base material 13, thereby obtaining the metal-formed product 12 transferred in reverse from the shape of the mold 11.

In the electroforming method of one or more embodiments of the present invention, as described above, the thick insulating layer 14 is formed so as to be placed on the upper surface of the conductive base material 13 and the insulating layer 14 is opened to form the cavity 15 in the mold 11. Therefore, by using photolithography technology or the like, the fine cavity 15 can be fabricated with precision. Thus, the fine, precise metal-formed product 12 can be fabricated by electroforming.

(Regarding Head Space)

Also, in the electroforming method of one or more embodiments of the present invention, as described above, the growth of the metal layer 18 is stopped, with the head space with the predetermined height left at an upper portion of the cavity 15. Therefore, a certain distance H can be kept between the upper surface of the metal layer 18 and the upper opening of the cavity 15. Among metal ions flowing into the cavity 15 to be deposited, metal ions flowing in a slanting direction into the cavity 15 at a circumferential edge of the upper opening of the cavity 15 are interrupted by the insulating layer 14 at the edge of the upper opening of the cavity 15, thereby causing a uniform electric current to flow over the entire upper surface of the metal layer 18 to let the metal layer 18 grow uniformly. Thus, the metal-formed product 12 formed with the growth of the metal layer 18 has a surface that faces the counter electrode on a side opposite to the conductive base material 13, the surface having a predetermined distance from the upper surface of the conductive base material 13 and having a shape imitated from the cavity 15.

In the following, the reason why a head-space height H to be left above the metal-formed product 12 when the metal-formed product 12 is formed is defined as follows:

$H \geq W/2.85$ where 300 μm≤W;

$H \geq W/3.75$ where 200 μm≤W<300 μm;

$H \geq W/4$ where 100 μm≤W<200 μm; and $H \geq W/10$ where W<100 μm (hereinafter referred to as growth-stop conditions).

Figure 20:
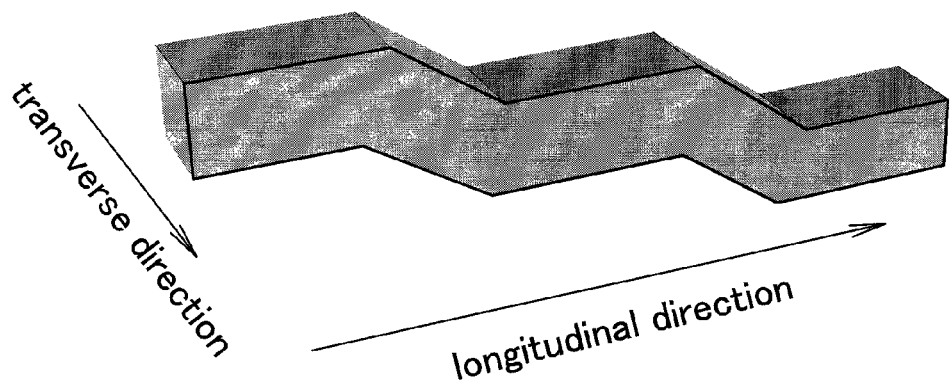
FIG. 20 is a perspective view of the shape of a contact member for electronic elements formed according to one or more embodiments of the present invention.

Note that the metal-formed product 12 may have a shape of a circular plate or a rectangular plate, or a shape elongated in one direction (for example, refer to FIG. 20). As such, the shape of the metal-formed product 12 fabricated according to one or more embodiments of the present invention is not particularly restrictive. Therefore when the metal-formed product 12 to be fabricated has a shape of a plate, the growth-stop conditions can be satisfied with regard to a cross section in its narrowest direction. In particular, in the metal-formed product having a shape elongated in one direction, the electrodepositing process can be controlled so that the growth-stop conditions are satisfied with regard to a cross section in a width direction (a traverse direction). In the following, an example of fabricating the metal-formed product 12 having a shape elongated in one direction is described as an example.

FIG. 5A is a plan view of the shape of a sample 22 used for defining a relation between the width W of the cavity 15 and the height H of the head space. Also, FIG. 5B is an enlarged view of a cross section of an A part of FIG. 5A. In this sample 22, fine-line parts 24 (each having a length of 4.5 mm) are arranged with predetermined pitches between band-shaped hoop parts 23a and 23b and between band-shaped hoop parts 23b and 23c, and the sample 22 has a thickness of 20 μm to 300 μm. These fine-line parts 24 are each elongated in one direction as a formed product depicted in FIG. 20 and each have a three-dimensional shape. The sample 22 is formed by using the mold 11 having the cavity 15 in a reversed shape of the sample 22 and electrodepositing a metal inside that cavity 15. Samples with the width W of the cavity 15 (the width in a traverse direction), the height H of the head space, a width L of the insulating layer 14, and others being changed were fabricated, a region indicated by a dotted line in FIG. 5A was cutout for analysis, and the degree of uniformity of the thickness of each of the fine-line parts 24 was examined.

According to the measurement results, it was found that thickness variability does not occur irrespectively of the width W of the cavity 15 (that is, the width of the fine-line part 24) if the height H of the head space is equal to or longer than the width W of the cavity 15 ($H/W \geq 1$). Also, as the width W of the cavity 15 is decreased, thickness variability of the fine-line parts 24 is decreased (this state can be found from FIG. 6).

Figure 6:
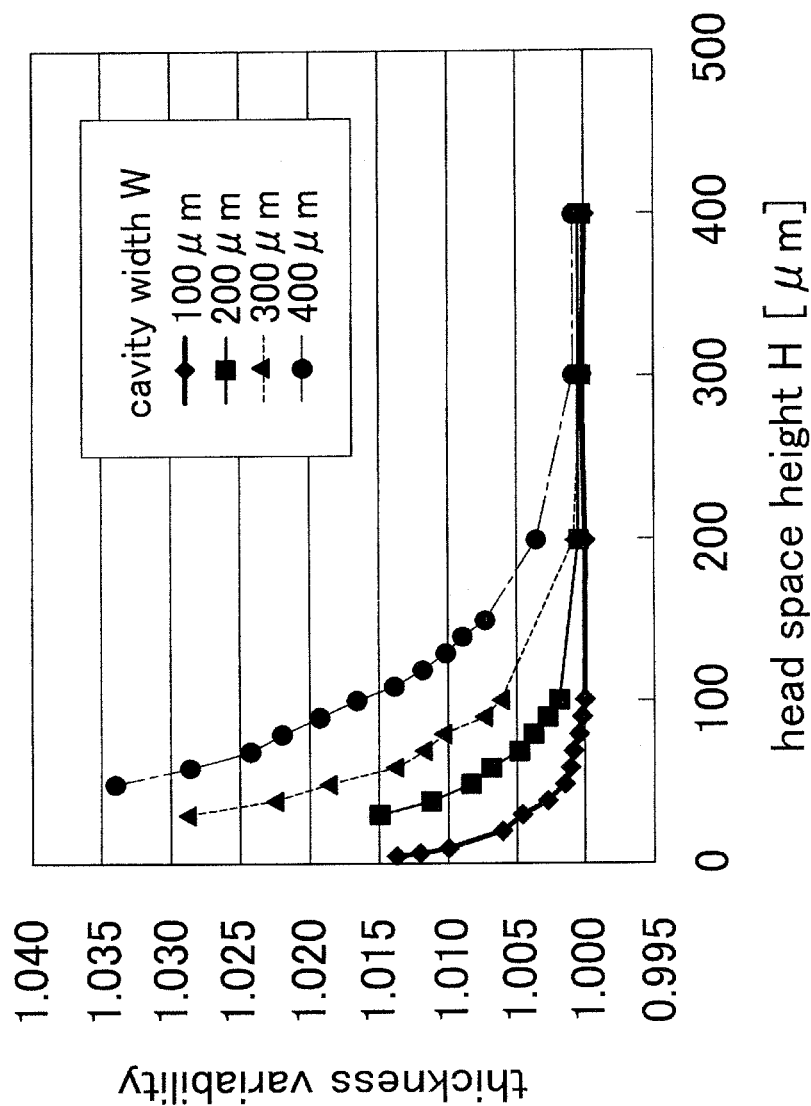
FIG. 6 is a drawing that shows the results of fabricating various samples by electrodepositing a metal in a cavity with a height H of the head space to be left above the metal layer being varied, and examining a relation between the height H of the head space and thickness variability of a fine-line part of each sample according to one or more embodiments of the present invention.

FIG. 6 shows the results obtained by electrodepositing a metal in the cavity 15 with the height H of the head space to be left above the metal layer 18 being changed to fabricate various samples 22 and examining a relation between the height H of the head space and thickness variability of the fine-line part 24 with actual measurement. As the mold 11, those with the cavity width W of 100 μm, 200 μm, 300 μm, and 400 μm were each used. Thickness variability of the fine-line part 24 (the metal-formed product) is represented by T2/T1 where a thickness of a thinnest part of the fine-line part 24 along a width direction is T1 and a thickness of a thickest part thereof is T2.

The thickness variability of the metal-formed product by electroforming is desirably equal to or lower than 1% as precision of products has been increased in recent years. Therefore, in FIG. 6, conditions for the thickness variability of the fine-line part 24 equal to or lower than 1.01 are defined such that the head-space height H is required to be equal to or longer than 140 μm when the cavity width W is 400 μm, the head-space height H is required to be equal to or longer than 80 μm when the cavity width W is 300 μm, the head-space height H is required to be equal to or longer than 50 μm when the cavity width W is 200 μm, and the head-space height H is required to be equal to or longer than 10 μm when the cavity width W is 100 μm.

Figure 7:
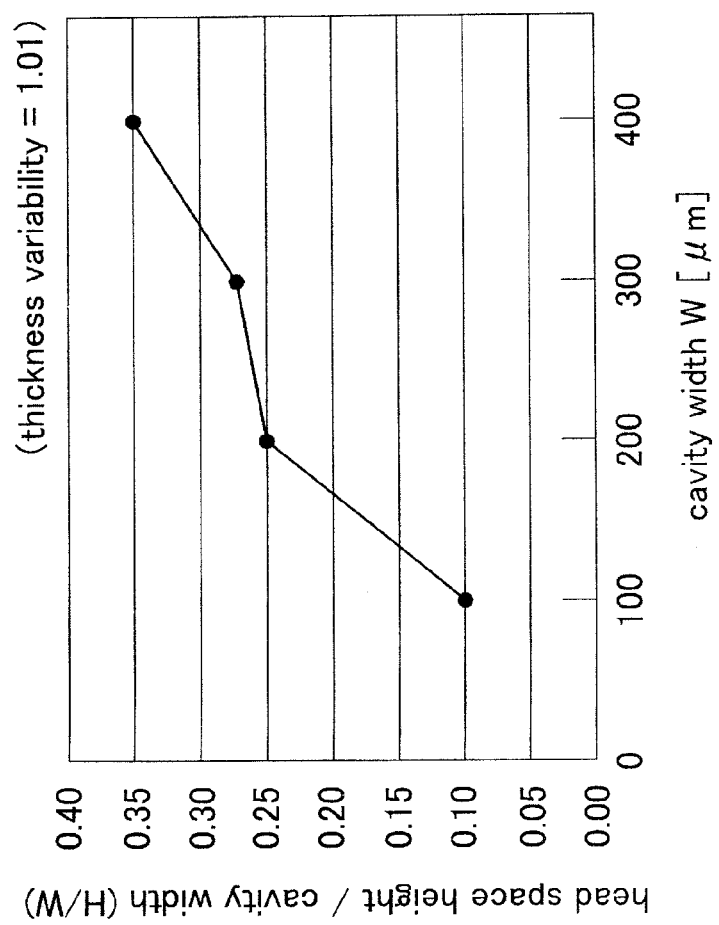
FIG. 7 is a drawing that shows conditions where a thickness variability of a fine-line part is 1.01, with a horizontal axis representing a cavity width W and a vertical axis representing an H/W ratio according to one or more embodiments of the present invention.

Because a correlation was found between the thickness variability of the fine-line part 24 and a ratio H/W of the head-space height H with respect to the cavity width W, conditions where the thickness variability is 1.01 are shown in FIG. 7, with a horizontal axis representing the cavity width W and a vertical axis representing the H/W ratio.

According to FIGS. 6 and 7, in order to suppress the thickness variability to a value equal to or smaller than 1.01, when the cavity width W is equal to or longer than 300 μm, a ratio of the head-space height H with respect to the cavity width W is required to be set as $H/W \geq 140/400 = 1/2.85$.

Also, when the cavity width W is equal to or longer than 200 μm and is shorter than 300 μm, the ratio of the head-space height H with respect to the cavity width W is required to be set as $H/W \geq 80/300 = 1/3.75$.

Furthermore, when the cavity width W is equal to or longer than 100 μm and is shorter than 200 μm, the ratio of the head-space height H with respect to the cavity width W is required to be set as $H/W \geq 50/200 = 1/4$.

Still further, when the cavity width W is shorter than 100 μm, the ratio of the head-space height H with respect to the cavity width W is required to be set as $H/W \geq 10/100 = 1/10$.

Figure 8:
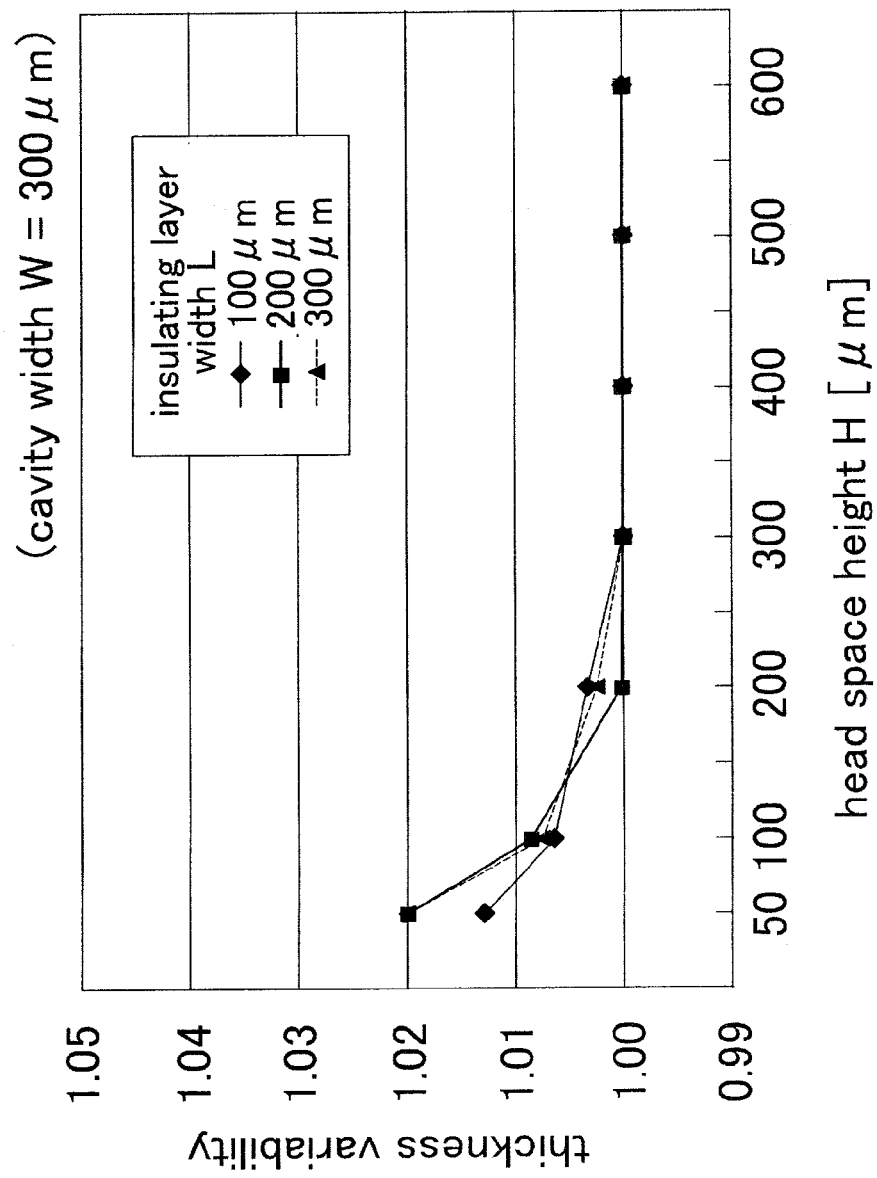
FIG. 8 is a drawing that shows the results of fabricating various samples by electrodepositing a metal in a cavity with the height H of the head space left above the metal layer being varied, and examining a relation between the height H of the head space and thickness variability of the fine-line part of each sample according to one or more embodiments of the present invention.

FIG. 8 shows the results of fabricating various samples 22 by electrodepositing a metal in the cavity 15 with the height H of the head space left above the metal layer 18 being varied, and examining a relation between the height H of the head space and the thickness variability of the fine-line parts 24. As the mold 11, one with the cavity width W of 300 μm was used, and the width L of the insulating layer 14 was varied as 100 μm, 200 μm, and 300 μm.

According to the measurement results, it can be found that thickness variability of the fine-line part 24 is decreased when the insulating-layer width L is shorter than 1/3 times as narrow as the cavity width W. Note that, according to theoretical calculation, thickness variability of the fine-line part 24 does not occur when the insulating-layer width L is 0.

Also, when an L/W ratio between the insulating-layer width L and the cavity width W is equal to or larger than 2/3, thickness variability does not change from the case in which the cavity width W is 300 μm as long as the head-space height H satisfies the conditions as described above. That is, as with the case in which the cavity width W is 300 μm, when the H/W ratio$\geq 1$ holds, thickness variability does not occur in the fine-line part 24, and decreases as the cavity width W decreases. Furthermore, the thickness variability of the fine-line part 24 can be small on the order of 1% as long as $H/W \geq 1/2.85$ where $300 \, \mu m \leq W$;

$H/W \geq 1/3.75$ where $200 \, \mu m \leq W < 300 \, \mu m$;

$H/W \geq 1/4$ where $100 \, \mu m \leq W < 200 \, \mu m$; and $H/W \geq 1/10$ where $W < 100 \, \mu m$.

In particular, even if the insulating-layer width L is extremely large, thickness variability of the fine-line part 24 can be small as long as the H/W ratio between the head-space height H and the cavity width W is equal to or larger than 1/2.85.

(Regarding Method of Forming Insulating Layer)

In one or more embodiments of the present invention, the insulating layer 14 is formed so as to be placed on the upper surface of the conductive base material 13. Therefore, the insulating layer 14 can be formed with a uniform thickness by a spray coater or a spin coater. Also, because the cavity 15 of a sharp shape can be formed, the metal-formed product 12 of a sharp shape can be formed. In particular, by using a spray coater, the insulating layer 14 can be formed with a uniform thickness even when the upper surface of the conductive base material 13 has asperities as in an embodiment that will be described further below. This point is described in comparison with a comparative example.

Figure 9:
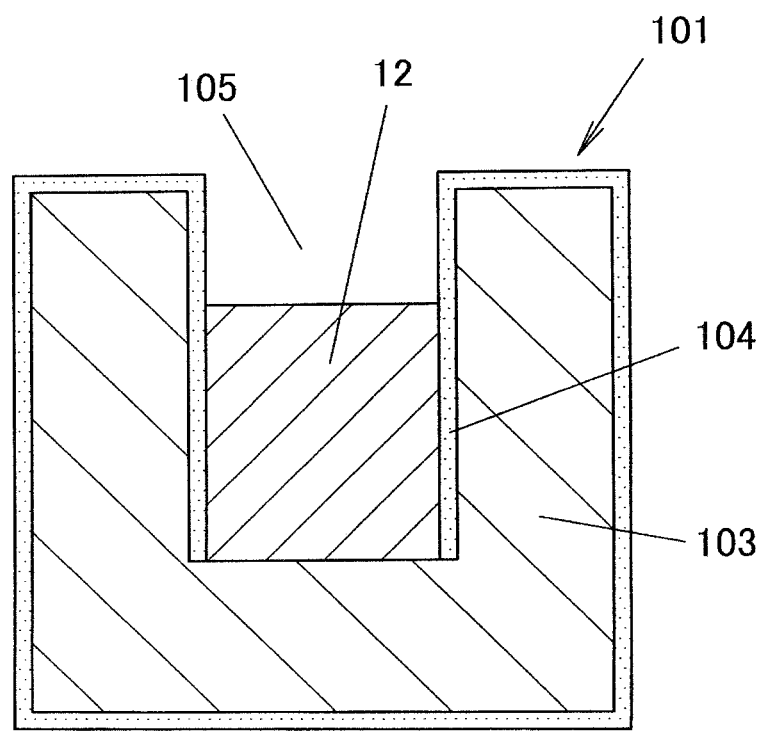
FIG. 9 is a sectional view of a comparative example according to one or more embodiments of the present invention.

FIG. 9 is a sectional view of a comparative example. A mold 101 of this comparative example is obtained by forming a cavity 105 directly on a metal-made conductive base material 103 and forming an insulating coat 104 on a surface of the conductive base material 103 excluding the bottom surface of the cavity 105. This mold 101 is deposited in an electrolytic bath, and metal ions are electrodeposited on the bottom surface of the cavity 105 to let a metal-formed product 12 grow.

Figure 10A:
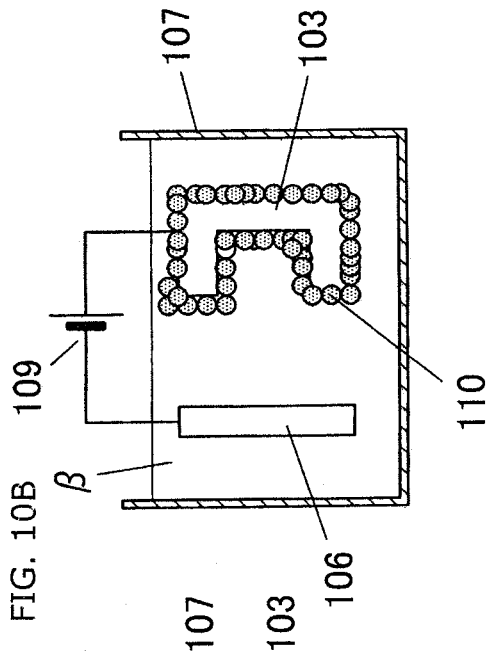
FIGS. 10A-10D are drawings that describe a method of forming an insulating coat by using an electrodeposition resist according to one or more embodiments of the present invention.
Figure 10B:
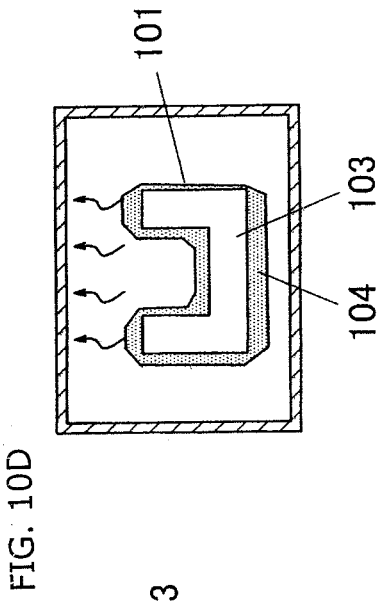
Figure 10C:
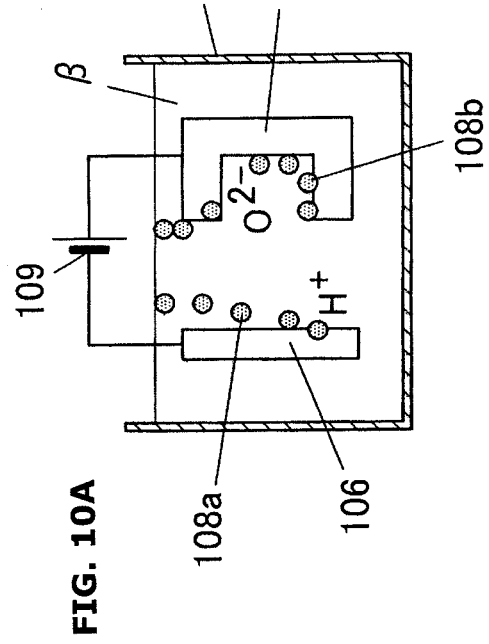
Figure 10D:
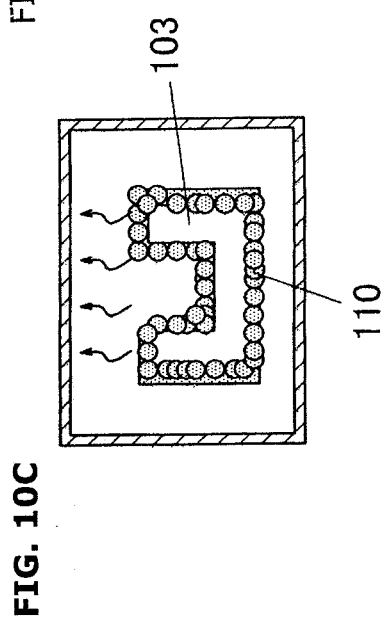

In this case of the mold 101, the insulating coat 104 is formed on the surface of the conductive base material 103 with an electrodeposition resist. FIGS. 10A to 10D are drawings that describe a method of forming the insulating coat 104 by using an electrodeposition resist. In the process of forming the insulating coat 104, as depicted in FIG. 10A, the conductive base material 103 formed with the cavity 105 is disposed in an electrodeposition resist liquid β of an electrolytic bath 107 so as to face a counter electrode 106. When an electric current is caused to pass through a direct-current power supply 109, water is electrolyzed, and hydrogen ions $108a$ ($H^+$) are absorbed to the counter electrode 106 and oxygen ions $108b$ ($O^{2-}$) are absorbed to the surface of the conductive base material 103. Furthermore, as depicted in FIG. 10B, a photosensitizing agent 110 (resin) as a component in the electrodeposition resist liquid β reacts with the oxygen ions on the surface of the conductive base material 103 to be solidified on the surface of the conductive base material 103. In this manner, the surface of the conductive base material 103 is covered with granular solidified substances of the photosensitizing agent 110. After taken out of the electrolytic bath 107, this conductive base material 103 is pre-baked as depicted in FIG. 10C. With pre-baking at a temperature on the order of 80 degrees Celsius to 100 degrees Celsius, the solvent of the photosensitizing agent 110 is volatilized and, at the same time, the photosensitizing agent 110 is fluidized, thereby filling a defective portion, such as a hole, of the photosensitizing agent 110. Next, as depicted in FIG. 10D, post-baking is performed at a temperate on the order of 120 degrees Celsius to 140 degrees Celsius to accelerate a thermal polymerization reaction of the photosensitizing agent 110. With this, the photosensitizing agent 110 is further fluidized to become a smooth coat, and is baked on the surface of the conductive base material 103 to form the insulating coat 104. Then, the insulating coat 104 is removed from the bottom surface of the cavity 105 to expose the conductive base material 103 to form the mold 101.

However, when the insulating coat 104 is formed with an electrodeposition resist in this manner, as a result of fluidization of the post-baked photosensitizing agent 110, the conductive base material 103 tends to become thin at outer edge portions (corner portions) of the conductive base material 103 and tends to become thick at inner edge portions (inner corner portions) of the cavity 105. As a result, in the cavity covered with the insulating coat 104, compared with the cavity 105 formed of the conductive base material 103 (the cavity before an insulating coat is formed), the inner edge portions and the outer edge portions in a cross section in a traverse direction tend to be round, and the metal-formed product 12 of a sharp shape is difficult to obtain.

Figure 11:
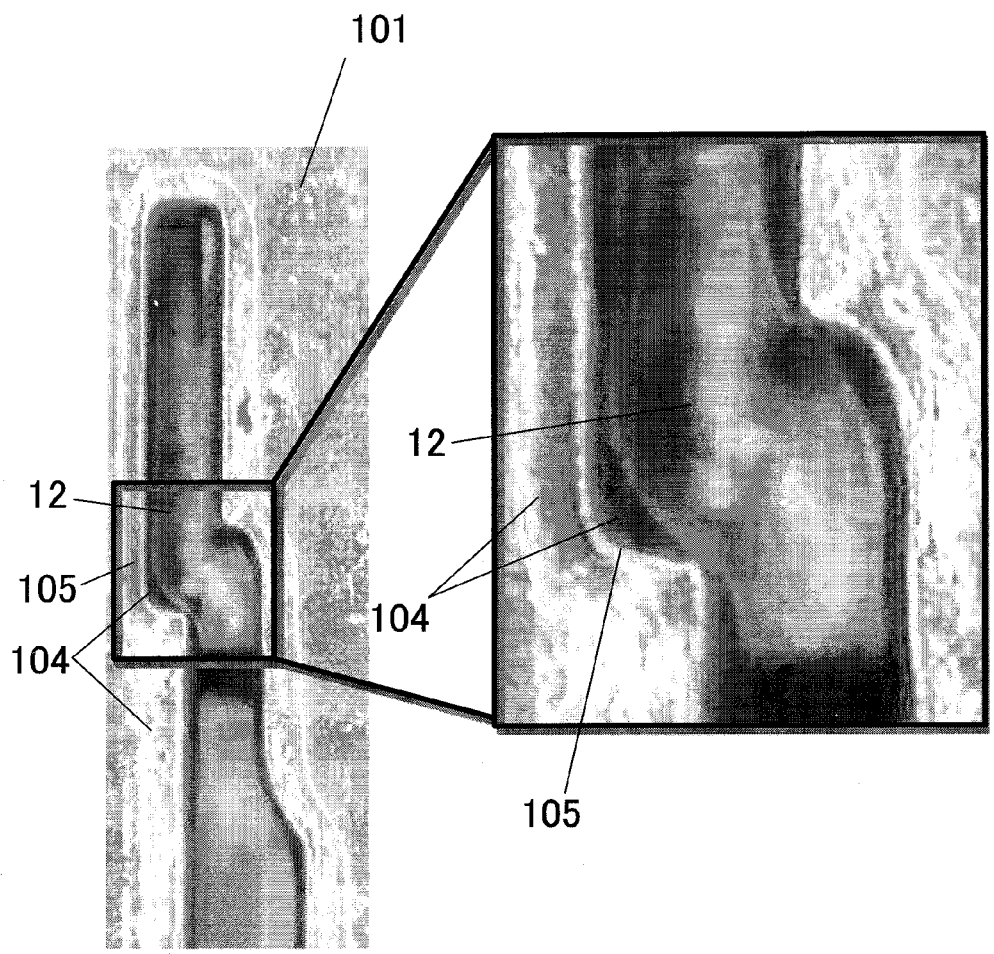
FIG. 11 is a plan view of a metal-formed product fabricated by using a mold of the comparative example according to one or more embodiments of the present invention.

FIG. 11 depicts a microphotograph of a plan view of the metal-formed product 12 fabricated by using the mold 101 fabricated in a manner as described above, and also depicts a partially enlarged view thereof. As described with reference to FIGS. 10A-10D, in the electrodeposition resist method, the inner edge portions and the outer edge portions in a cross section in a traverse direction are round. In practice, however, the corners (sides) of the cavity 105 of a three-dimensional shape are round, and therefore the inner edge portions of the cavity 105 are also round in a planar view. For this reason, the metal-formed product 12 formed in this cavity 105 has round corners in a planar view as depicted in FIG. 11. As can be seen from FIG. 11, when the metal-formed product 12 is fabricated by using this mold 101, the inner edge portions and the outer edge portions in the cavity 105 are rounded by the insulating coat 104. Therefore, even if the cavity 105 of a sharp shape is formed in the conductive base material 103, it is difficult to transfer the sharp shape to the metal-formed product 12 and, in particular, its corners are rounded.

Figure 12:
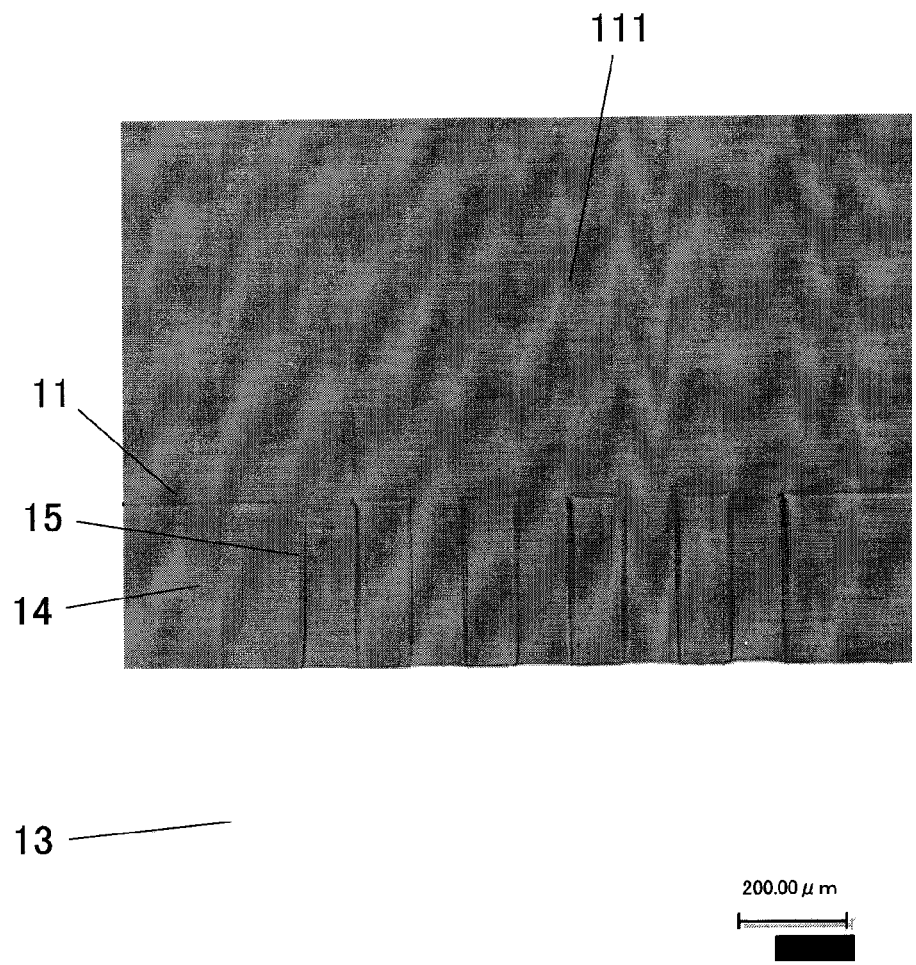
FIG. 12 is a drawing that depicts a cross section of an insulating layer formed on a conductive base material by using a spray coater and photolithography technology according to one or more embodiments of the present invention.

By contrast, in a method of opening the insulating layer 14 formed on the conductive base material 13 as the cavity 15, a resist is coated on the surface of the conductive base material 13 by using a spray coater or a spin coater, and the cavity 15 is formed by photolithography technology. Therefore, the cavity 15 can be precisely and sharply formed. FIG. 12 is a drawing that depicts a photograph of a cross section of the insulating layer 14 formed on the conductive base material 13 by using a spray coater and photolithography technology. Note that, in a sample of FIG. 12, in order to prevent the shape of the insulating layer 14 from deforming when the mold 11 is cut, the upper surface of the insulating layer 14 and the inside of the cavity 15 are solidified with a resin 111.

In the mold 11 of one or more embodiments of the present invention, the cavity 15 of a sharp shape as depicted in FIG. 12 can be formed. Therefore, by forming the metal-formed product 12 in this cavity 15, the metal-formed product 12 of a sharp shape can be fabricated.

(Regarding Thickness of Insulating Layer)

Also, in the electroforming method of one or more embodiments of the present invention, a minimum height of the head space to be left above the metal layer 18 (that is, a maximum value of the thickness of the metal layer with respect to a thickness of the insulating layer) is defined according to the width of the cavity 15. Therefore, a metal-formed product can be efficiently formed with a minimum thickness of the insulating layer (that is, a space-saving member) determined with the width of the recessed part and the thickness of the metal-formed product to be formed.

Furthermore, a thinner thickness of the insulating layer 14 can make the edge shape of the insulating layer 14 more accurate in the photolithography process, and accuracy in electroforming of the metal-formed product 12 also increase accordingly. Still further, a thinner thickness of the insulating layer 14 can shorten the time required for forming and removing a photoresist, thereby improving efficiency of production of the metal-formed product 12. As a result, an increase in quality and a decrease in cost of the metal-formed product 12 can be achieved.

Second Embodiment of the Invention

Figure 13A:
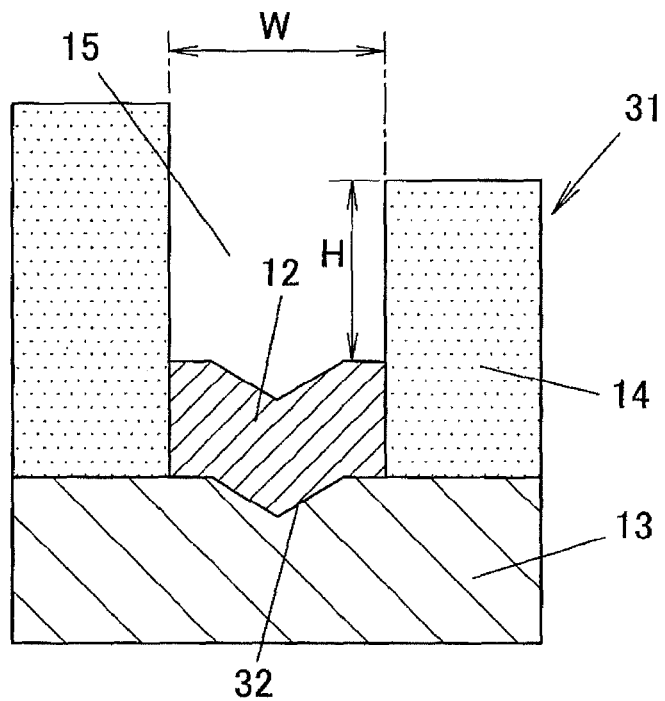
FIG. 13A is a sectional view of a mold according to a second embodiment of the present invention.

FIG. 13A is a sectional view of a mold 31 according to a second embodiment of the present invention. In this mold 31, a recess 32 of a desired shape is formed on the upper surface of the conductive base material 13 in the cavity 15, and this recess 32 configures part of the cavity 15. Thus, by electrodepositing a metal inside the cavity 15, the metal-formed product 12 of a more sophisticated shape can be formed.

Figure 13B:
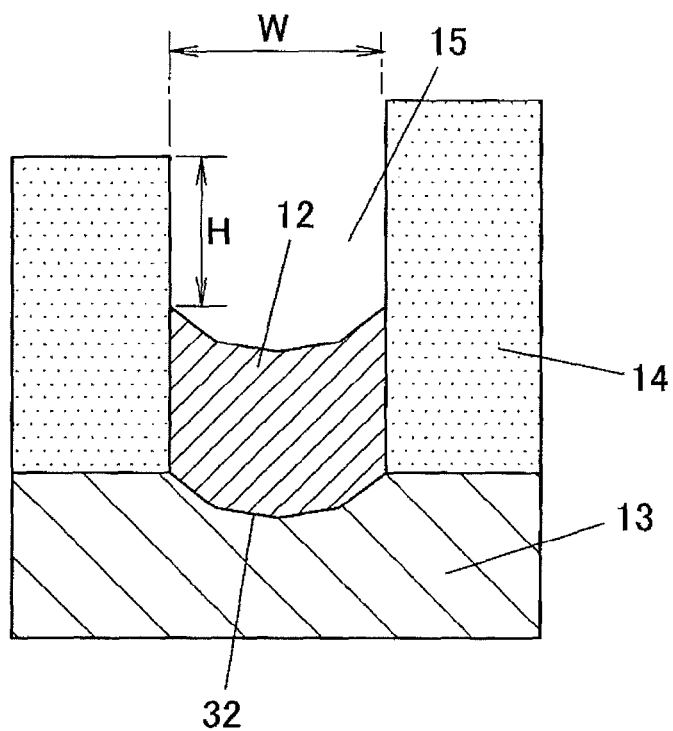
FIG. 13B is a sectional view of another mold according to the second embodiment of the present invention.

Also, while the recess 32 is formed in part of the bottom surface of the cavity 15 in the embodiment depicted in FIG. 13A, the recess 32 may be formed in the entire bottom surface of the cavity 15, as depicted in another embodiment depicted in FIG. 13B.

Figure 14:
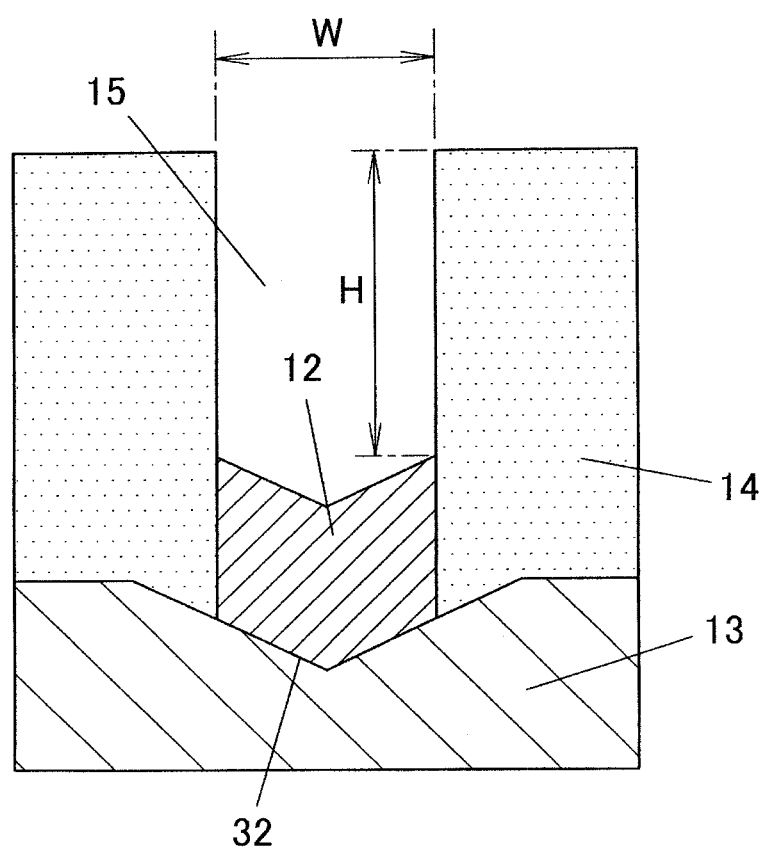
FIG. 14 is a sectional view of still another mold of the second embodiment of the present invention.

Furthermore, in still another embodiment depicted in FIG. 14, the recess 32 is formed on the upper surface of the conductive base material 13 in a range wider than the bottom surface of the cavity 15, and part of the recess 32 is filled with the insulating layer 14.

Note that when the upper surface of the metal-formed product 12 is not flat as depicted in FIGS. 13A and 13B and FIG. 14, the head-space height H is assumed to be measured from a highest position of the metal-formed product 12. Also, when the height of the insulating layer 14 is not uniform as depicted in FIGS. 13A and 13B, the head-space height H is assumed to be obtained by measuring a height of an upper surface of the insulating layer 14 at a lowest position. Therefore, in the cases as depicted in FIGS. 13A and 13B, the head-space height H is a vertical distance from a highest position of the metal-formed product 12 to the upper surface of the insulating layer 14 at a lowest position. Furthermore, when the upper surface of the conductive base material 13 is formed as an inclined surface in a cross section in a traverse direction as depicted in FIGS. 13A, 13B, and 14, the thickness variability is evaluated with a thickness in the direction of the normal orthogonal to that inclined surface.

Third Embodiment of the Invention

Figure 15:
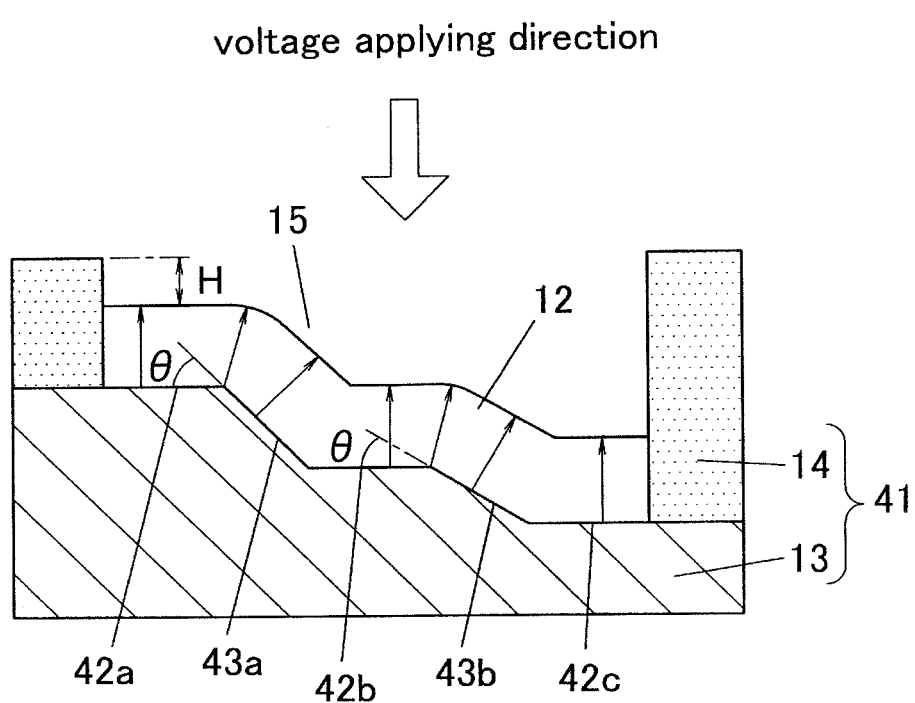
FIG. 15 is a sectional view of a mold and a metal-formed product along a longitudinal direction according to a third embodiment of the present invention.

FIG. 15 is a sectional view of a mold 41 and the metal-formed product 12 along a longitudinal direction according to a third embodiment of the present invention. In the present embodiment, a bottom shape of the cavity 15 in a longitudinal direction is described, by way of example. The description, however, can be applied to a bottom surface in a traverse direction and also to the case where the surfaces in both longitudinal and traverse directions are inclined. However, in any of these cases, electrodeposition in a traverse direction is performed within a range described in the first embodiment. In the present embodiment, in the cross section in the traverse direction, electrodeposition is performed according to the conditions as described in the first embodiment. Furthermore, by performing electroforming also in the longitudinal direction according to the conditions as described in the first embodiment, in comparison between a upper flat part 42a and a lower flat part 42c as in the first embodiment, thickness variability can be decreased with considerably high accuracy although the thickness variability is not within a range of 1%. The cavity 15 formed in this mold 41 has different depths of the bottom surface, and includes three flat parts 42a, 42b, and 42c each facing the counter electrode (perpendicular to a voltage applying direction) and inclined surface parts 43a and 43b connecting the flat parts 42a, 42b, and 42c and inclined with respect to a plane perpendicular to the voltage applying direction.

Here, the height H of the head space represents the height of a space left in a shallowest portion of the cavity 15. As depicted in this FIG. 15, in the longitudinal direction of the cavity 15, even when the length of the cavity 15 is long compared with the height H of the head space, thickness variability of the metal-formed product 12 can be decreased as long as the height H of the head space satisfies any of the conditions described above with respect to the width W (the length in a depth direction in paper=the width of the recessed part) of the cavity 15.

Also, the metal layer 18 is laminated and electrodeposited on the bottom surface having the inclined surface parts 43a and 43b so that the metal layer 18 has the same thickness with respect to the flat parts 42a, 42b, and 42c and the inclined surface parts 43a and 43b (the distance from the bottom surface is constant). Also at a corner part formed by the flat part 42a and the inclined surface part 43a and a corner part formed by the flat part 42b and the inclined surface part 43b, the metal layer 18 is laminated and electrodeposited so that the metal layer 18 has an approximately same thickness (the distance from the bottom surface of the cavity 15 is constant). Arrows in FIG. 15 represent vectors indicating a growing direction of the metal layer 18.

Note that while FIG. 15 depicts a cross section in the longitudinal direction, if it is assumed that this is a cross section in a traverse direction, the thickness of the metal layer 18 in the inclined surface parts is not considered when a thickness variability is calculated, and the thickness of the metal layer 18 in each flat bottom surface is measured. A ratio of a thickness T2 at a thickest position with respect to a thickness T1 at a thinnest position, that is, T2/T1, is taken as a thickness variability. That is, in a cross section in the traverse direction, when the bottom surface of the cavity 15 is a flat surface as in the first embodiment or an inclined surface as in the second embodiment, the thickness of the flat surface or the inclined surface in a direction of the normal is evaluated. However, when a flat surface and an inclined surface are mixed together, evaluation is made only with the thickness of the flat surface.

Figure 16:
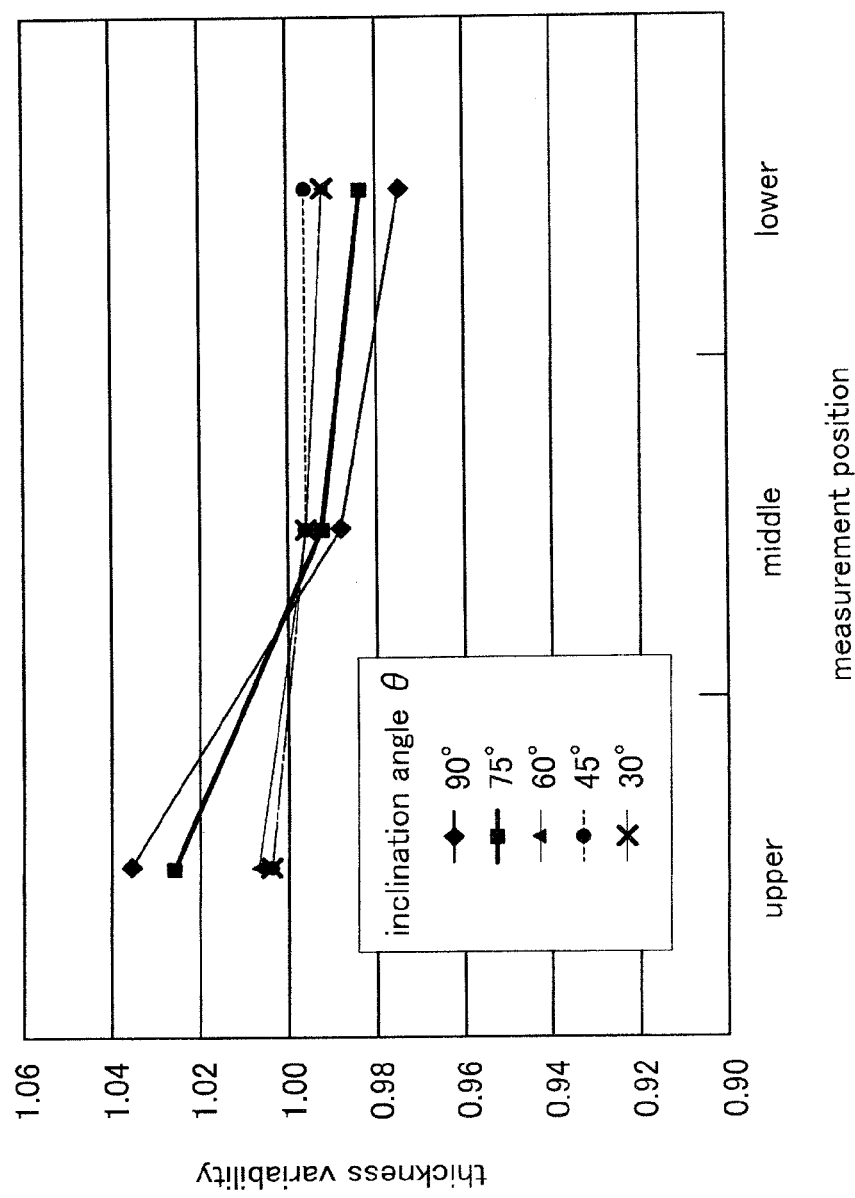
FIG. 16 is a drawing that depicts the results of measuring thickness variability of the metal layer with an angle of inclination of the inclined surface parts being changed according to one or more embodiments of the present invention.

FIG. 16 is a drawing that depicts the results of measuring thickness variability of the metal layer 18 with an angle of inclination θ (an angle formed with a plane perpendicular to the voltage applying direction) of the inclined surface parts 43a and 43b being changed. As depicted in the drawing, when the angle of inclination θ of the inclined surface parts 43a and 43b are equal to or smaller than 60 degrees, the thickness variability of the metal layer 18 is equal to or smaller than 1%. However, when the angle of inclination θ of the inclined surface parts 43a and 43b exceeds 60 degrees, thickness variability of the metal layer 18 occurs. Note that this thickness variability of the metal layer 18 tends to be larger in the upper flat part 42a and the lower flat part 42c than in the middle flat part 42b.

Figure 17:
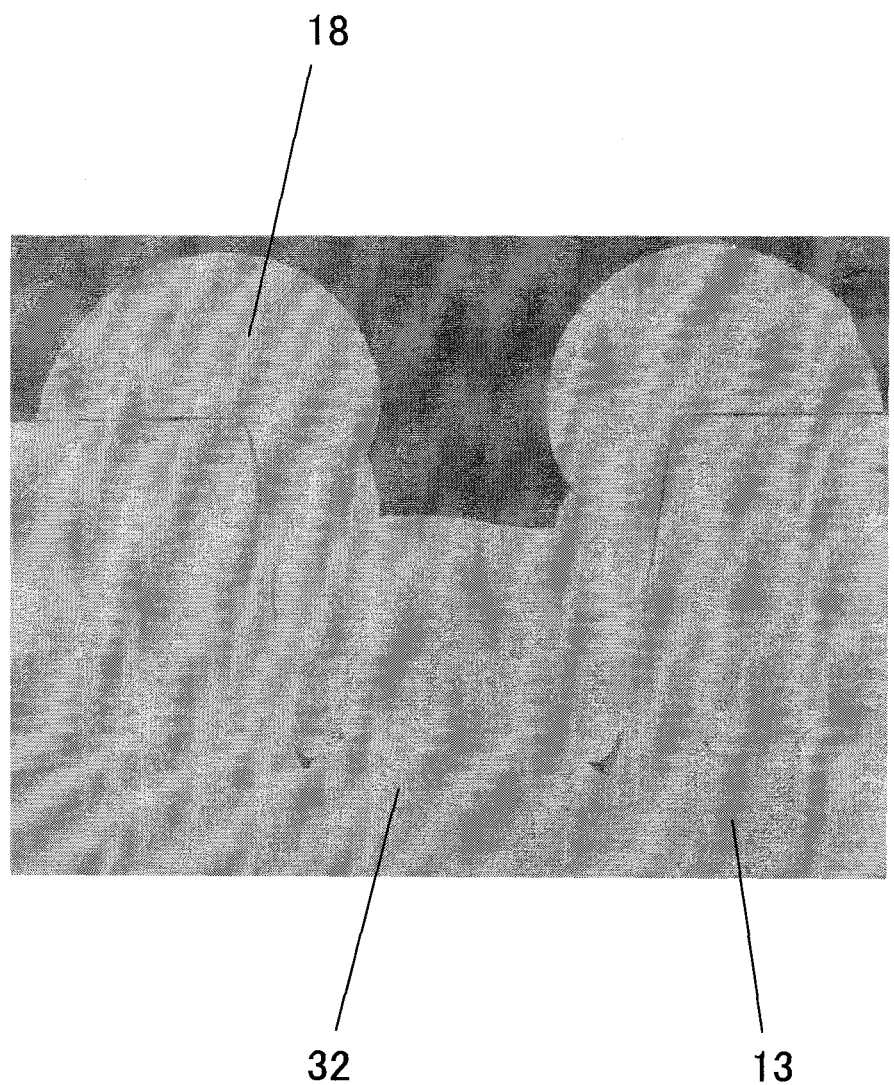
FIG. 17 is a drawing that depicts the state of growth of a metal layer when a recess having an inclined surface at an angle of inclination equal to or larger than 60 degrees is provided in an upper surface of a conductive base material according to one or more embodiments of the present invention.
Figure 18:
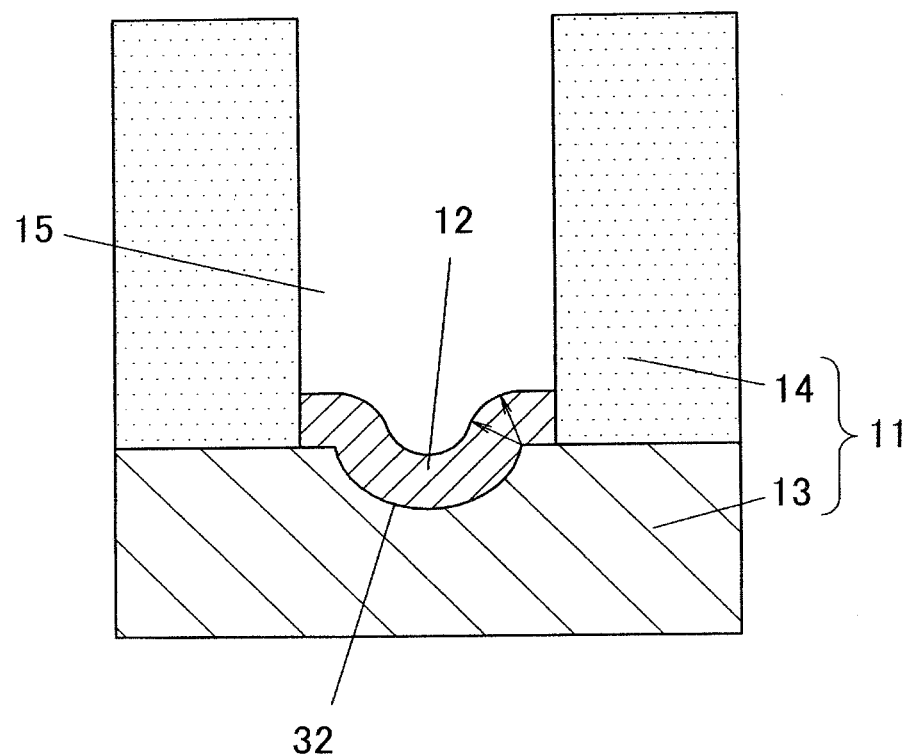
FIG. 18 is a sectional view for describing that even an angle of inclination equal to or larger than 60 degrees at a part of the recess of the conductive base material hardly influences the growth of the metal layer according to one or more embodiments of the present invention.

Therefore, the surface of the recess 32 in the conductive base material 13 exposed from the bottom surface of the cavity 15 may have an angle of inclination with respect to a plane perpendicular to the voltage applying direction equal to or smaller than approximately 60 degrees. FIG. 17 is a drawing that depicts the state of growth of the metal layer 18 when the recess 32 with an inclined surface at an angle of inclination equal to or larger than 60 degrees is provided on the upper surface of the conductive base material 13. As such, when the angle of inclination exceeds 60 degrees, the electric current becomes non-uniform, thereby making it difficult to control the thickness of the metal layer 18. As depicted in FIG. 18, however, as in the case where the angle of inclination of a circumferential edge portion of the recess 32 is equal to or larger than 60 degrees, even when a region at its angle of inclination equal to or larger than 60 degrees is present, this does not have much influence as long as such a region is partial. Also, when a sharp inflection point part is present on the upper surface of the conductive base material 13 as depicted in FIG. 18, as indicated by arrows in FIG. 18, in the inflection point part, the metal layer 18 grows so as to have a uniform thickness centering at the inflection point. Therefore, an inflection point part on the upper surface of the metal layer 18 corresponding to the inflection point part of the conductive base material 13 is smooth in an round shape. In the examples depicted in FIGS. 13, 14, 23B, and others, the upper surface of the metal layer 18 is also curved in a manner similar to that of the upper surface of the conductive base material 13. In the actual metal-formed product 12, the curved part is rounded to form an round shape.

As such, in one or more embodiments of the present invention, the depth of the bottom surface is changed so that the angle of inclination θ of the inclined surface parts 43a and 43b is approximately equal to or smaller than 60 degrees. With this, the design of the metal-formed product 12 can be curved in the voltage applying direction while keeping the thickness constant. In short, the bottom surface of the cavity 15 does not necessarily face the counter electrode.

Figure 19:
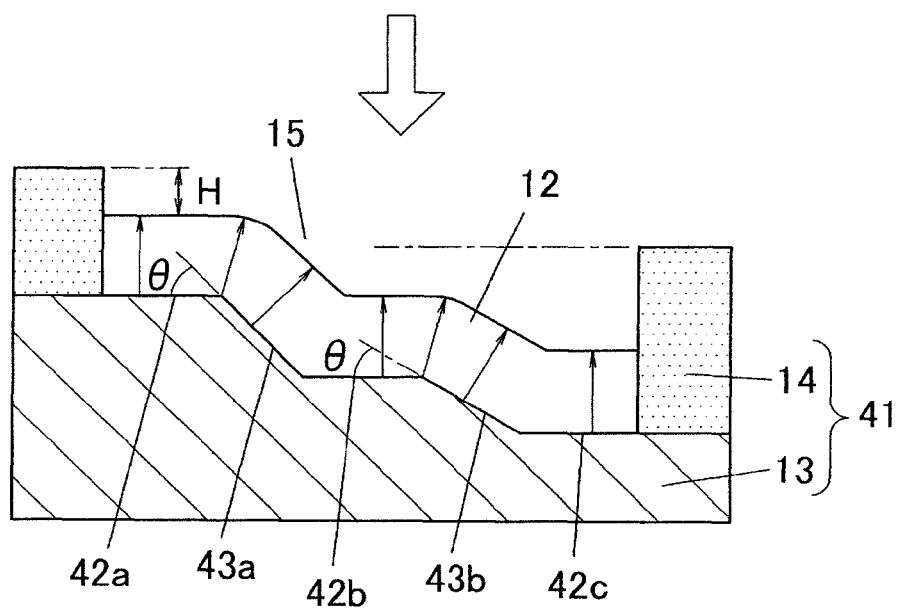
FIG. 19 is a sectional view of another example of the third embodiment.

Note that the height of the insulating layer 14 may not be uniform. Therefore, as depicted in FIG. 19, a part where the height of the insulating layer 14 in the longitudinal direction is low may be lower than the highest position of the upper surface of the metal layer 18. However, even in the case as depicted in FIG. 19, the insulating layer 14 when viewed in cross section in a traverse direction, the conditions as in the first embodiment are satisfied for the metal-formed product 12.

As an example of the third embodiment, the shape of a contact member for electronic elements formed according to one or more embodiments of the present invention is depicted in FIG. 20. According to one or more embodiments of the present invention, the metal component of this shape can be formed only by electroforming without requiring any finishing.

Fourth Embodiment of the Invention

Figure 21:
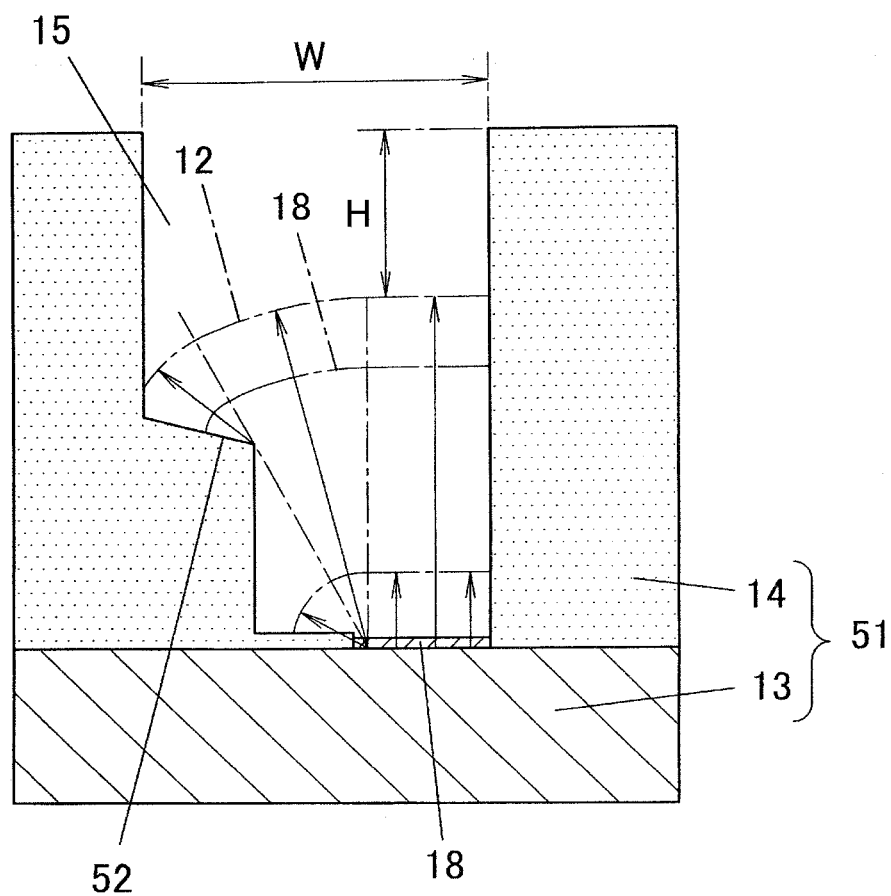
FIG. 21 is a drawing that depicts a cavity of a mold and a process of growth of a metal layer according to a fourth embodiment of the present invention.

FIG. 21 is a drawing that depicts a cavity 15 of a mold 51 and a process of growth of a metal layer 18 according to a fourth embodiment of the present invention. Arrows in FIG. 21 represent vectors each indicating a growing direction and amount of growth of the metal layer 18. In this cavity 15, a step part 52 is formed at some midpoint on a side wall surface of the cavity 15, thereby expanding the cross-sectional area of the cavity 15 midway to make an opening area of the cavity 15 larger than the bottom surface. Also, the insulating layer 14 stretches so as to cover part of a circumferential edge part on the bottom surface of the cavity 15. The stretching part of the insulating layer 14 on the bottom surface is indicated as an insulating layer 14a.

When electroforming is performed by using this cavity 15, a metal is first electrodeposited on a region of the bottom surface of the cavity 15 not covered with the insulating layer 14a to form the metal layer 18. When a voltage is further applied, the metal layer 18 grows to cover the insulating layer 14 so that the distance from the part of the bottom surface not covered with the insulating layer 14a is constant.

When an electric current is further caused to flow to make the metal layer 18 grow, the metal layer 18 grows so as to project also over the step part 52. At this time, in a part hidden by the step part 52 when viewed from the bottom surface not covered with the insulating layer 14a, the metal layer 18 grows so that the distance from an edge of the step part 52 is constant.

In this manner, by providing the step part 52 to the cavity 15, the metal-formed product 12 can be casted in a shape protruding over the upper part of the step part 52. Also, by covering the perimeter edge part of the bottom surface of the cavity 15 with the insulating layer 14a, the metal-formed product 12 can be shaped as being chamfered at its upper part. That is, by using this modified example, it is possible to form a metal component chamfered in an round shape on a surface formed by reversely transferring the shape of the mold 11.

Figure 22:
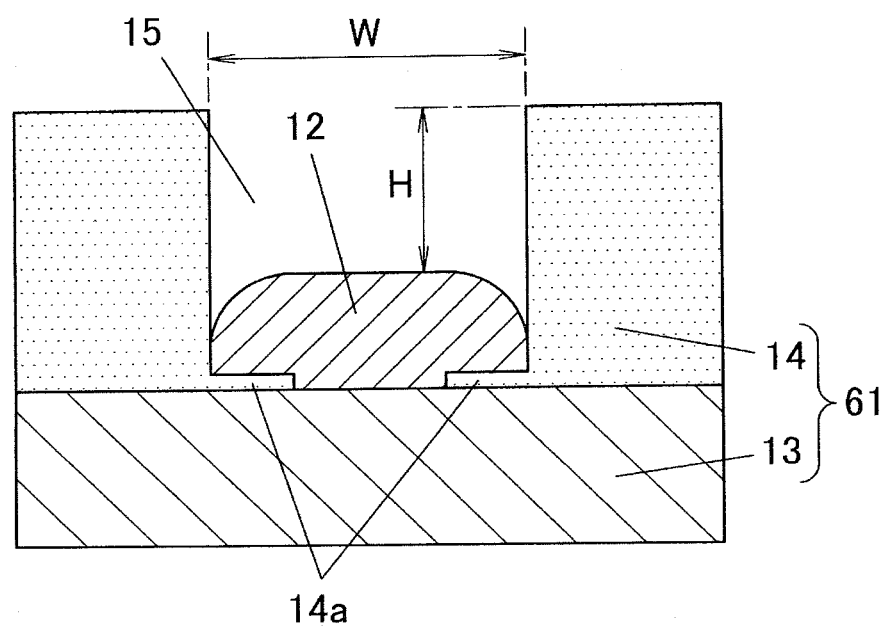
FIG. 22 is a sectional view of another embodiment of the fourth embodiment of the present invention.

FIG. 22 is a sectional view of another example in which the insulating layer 14a is provided on the bottom surface of the cavity 15. In this mold 61, the insulating layer 14 stretches so as to cover part of the bottom surface along both sides or an outer perimeter edge of the bottom surface of the cavity 15 to form the insulating layer 14a on the bottom surface. Even when this mold 16 is used, the metal layer 18 grows to cover the insulating layer 14a so that the distance from the part of the bottom surface not covered with the insulating layer 14a is constant. With this, the upper outer perimeter part of the metal-formed product 12 is formed as being curved in an round shape.

Note that, as in the present embodiment, when the bottom surface of the cavity 15 is partially covered with the insulating layer 14a and part of the upper surface of the metal layer 18 is curved, thickness variability of the metal layer 18 is evaluated in a region having an approximately uniform thickness of the metal layer 18 in a perpendicular direction on a region where the conductive base material 13 is exposed.

Other Embodiments

In the following, molds 71 to 88 of various shapes are described.

Figure 23A:
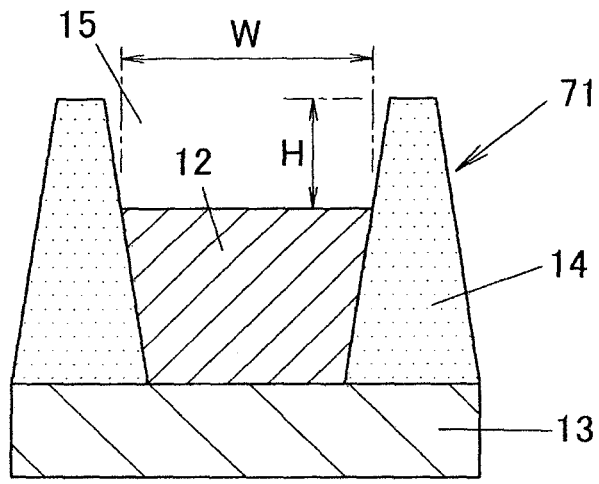
FIGS. 23A and 23B are sectional views each depicting a mold according to one or more embodiments of the present invention.

In FIG. 23A, the mold 71 having an insulating layer 14 with both side surfaces tapered so as to have a narrow width above is used.

Figure 23B:
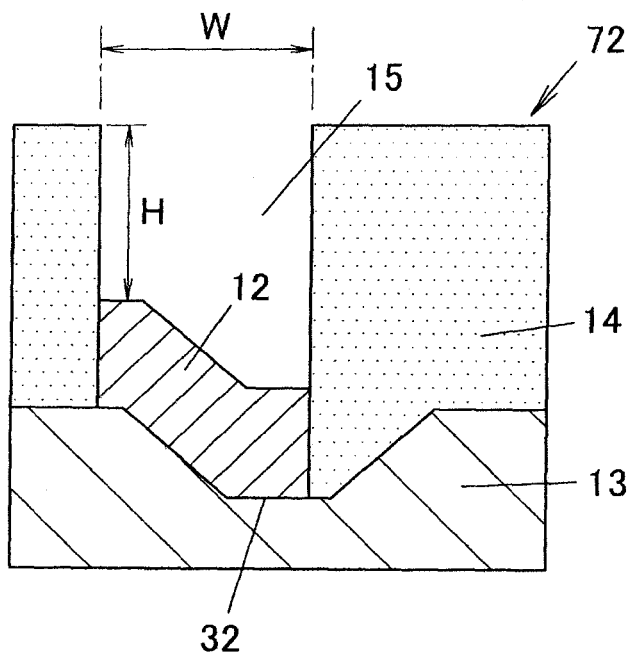

The mold 72 depicted in FIG. 23B has a recess 32 on the upper surface of the conductive base material 13. An insulating layer 14 on one side wall surface is outside of the recess 32, and an insulating layer 14 on the other side wall surface enters the recess 32.

Figure 24A:
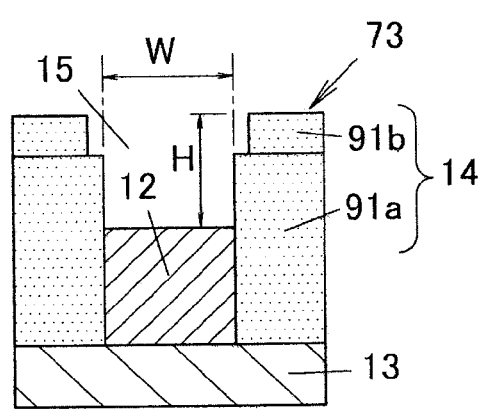
FIGS. 24A-24D are sectional views each depicting a mold according to one or more embodiments of the present invention.

In the mold 73 depicted in FIG. 24A, an insulating layer 14 has a two-layer structure of insulating layers 91a and 91b. The insulating layer 91b with a wider opening width is placed on the insulating layer 91a with a narrower opening width.

Figure 24B:
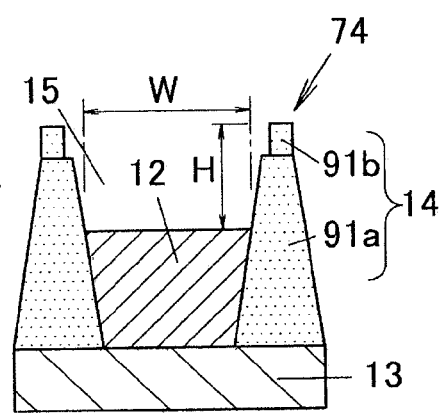

In the mold 74 depicted in FIG. 24B, a two-layer-structured insulating layer 14 is provided by placing an insulating layer 91b with a wider opening width on an insulating layer 91a tapered in cross section to be narrower above.

Figure 24C:
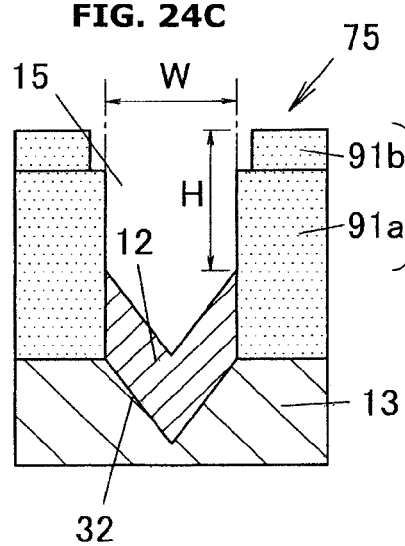

In the mold 75 depicted in FIG. 24C, a V-grooved recess 32 is formed in the bottom surface of the cavity 15, and a two-layer-structured insulating layer 14 is provided by placing an insulating layer 91b with a wider opening width on an insulating layer 91a with a narrow opening width.

Figure 24D:
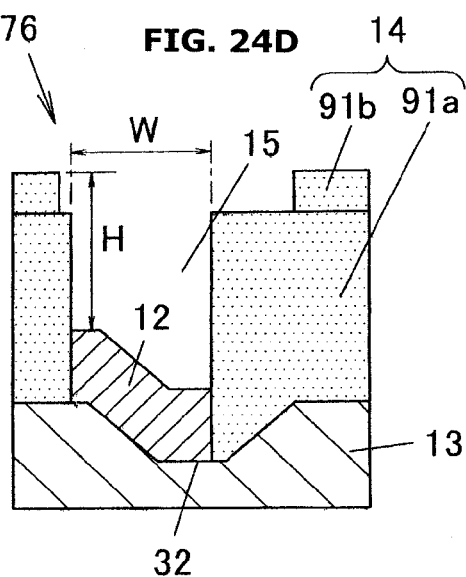

In the mold 76 depicted in FIG. 24D, based on the mold 72 of FIG. 23B, the insulating layer 14 has a two-layer structure of an insulating layer 91a with a narrower opening width and an insulating layer 91b with a wider opening width.

Figure 25A:
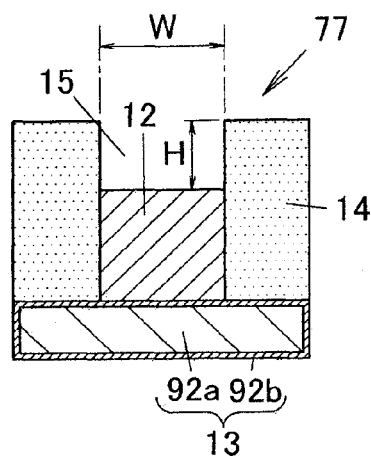
FIGS. 25A-25D are sectional views each depicting a mold according to one or more embodiments of the present invention.

In the mold 77 depicted in FIG. 25A, a conductive base material 13 obtained by coating the surface of a core material 92a made of a non-conductive material (an insulating material) with a conductive coat part 92b made of a conductive material is used.

Figure 25B:
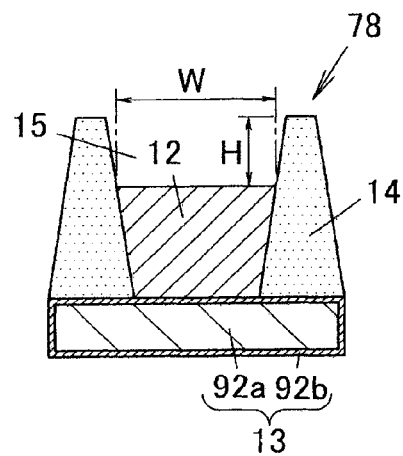
Figure 25C:
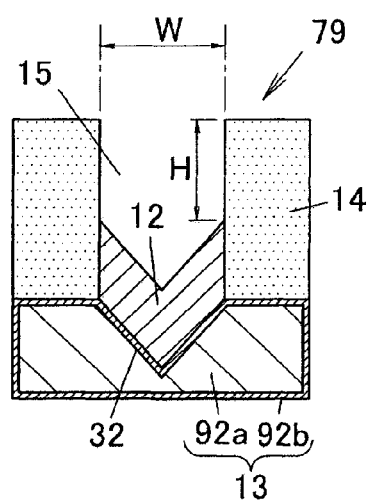
Figure 25D:
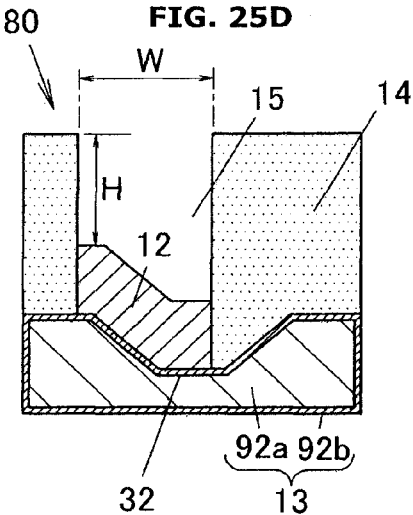
Figure 26A:
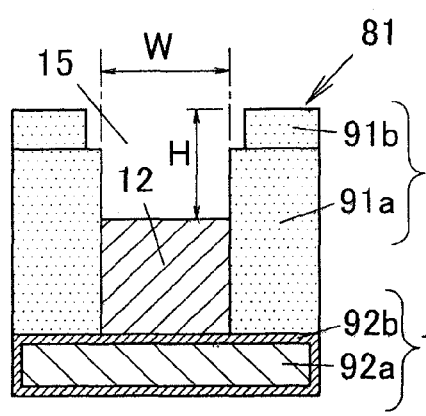
FIGS. 26A-26D are sectional views each depicting a mold according to one or more embodiments of the present invention.
Figure 26B:
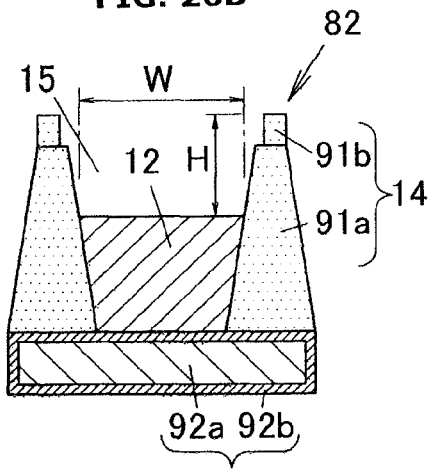
Figure 26C:
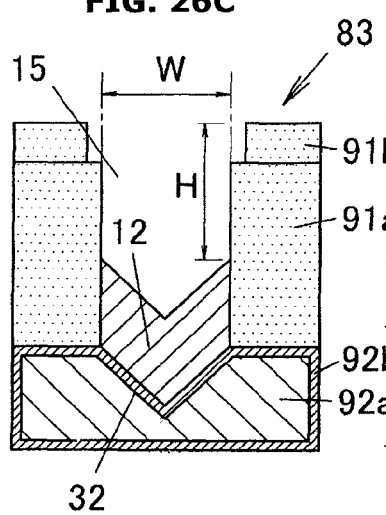
Figure 26D:
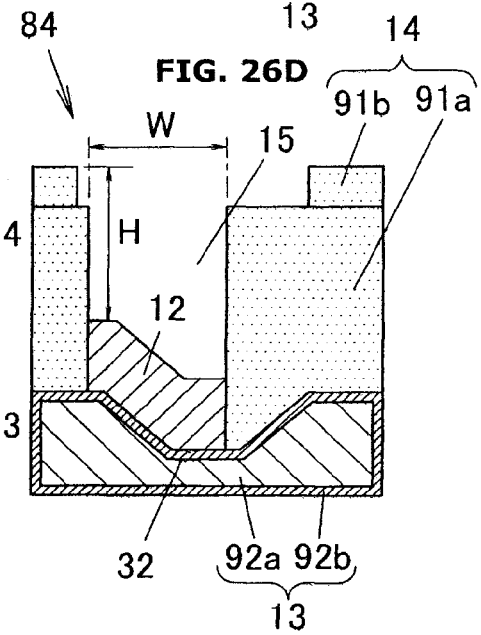

Also in the molds 78 to 80 depicted in FIGS. 25B to 25D, a conductive base material 13 obtained by coating the surface of a core material 92a made of a non-conductive material (an insulating material) with a conductive coat part 92b made of a conductive material is used. Furthermore, in the mold 78 of FIG. 25B, the insulating layer 14 is in a tapered shape. In the molds 79 and 80 of FIGS. 25C and 25D, the conductive base material 13 has a recess 32 is used.

In any of the molds 81 to 84 depicted in FIGS. 26A to 26D, an insulating layer 14 has a two-layer structure of insulating layers 91a and 91b, the insulating layer 91b with a wider opening width is placed on the insulating layer 91 with a narrower opening width, and a conductive base material 13 obtained by coating the surface of a core material 92a made of a non-conductive material (an insulating material) with a conductive coat part 92b made of a conductive material is used.

Figure 27A:
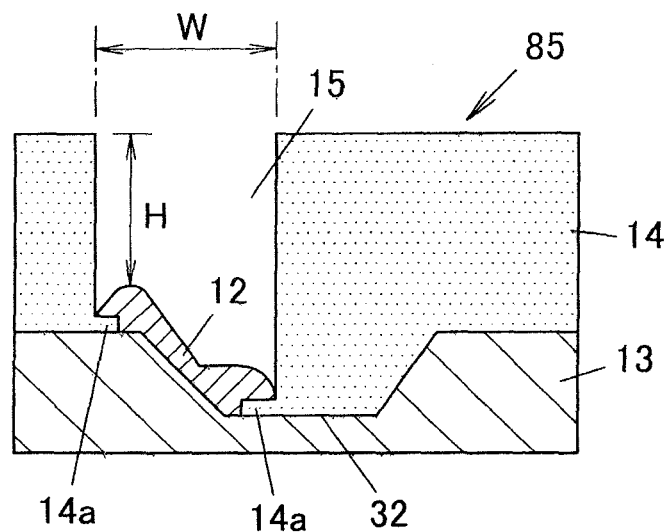
FIGS. 27A-27B are sectional views each depicting a mold according to one or more embodiments of the present invention.
Figure 27B:
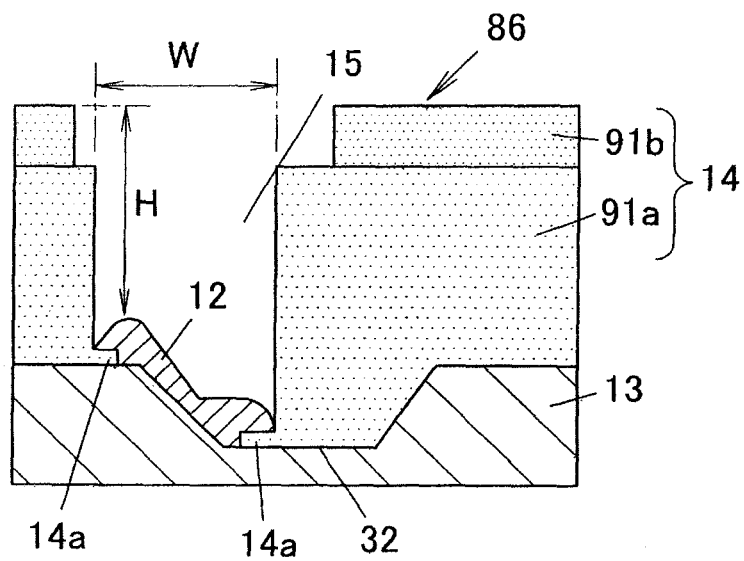
Figure 28A:
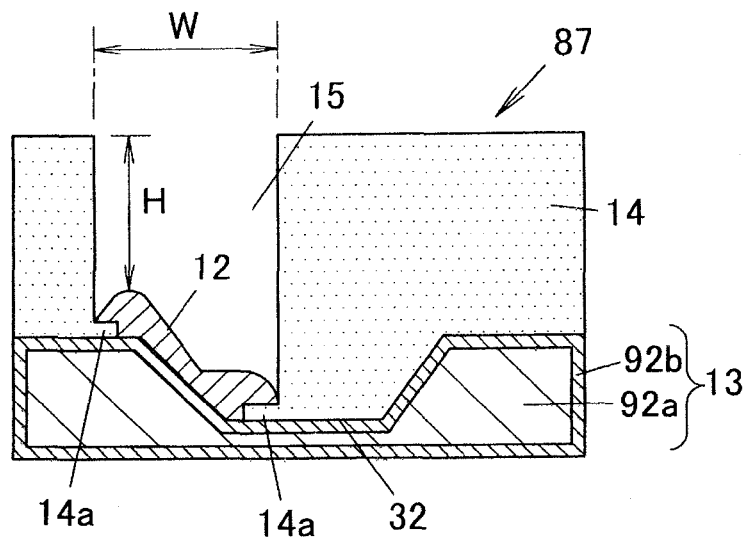
FIGS. 28A-28B are sectional views each depicting a mold according to one or more embodiments of the present invention.
Figure 28B:
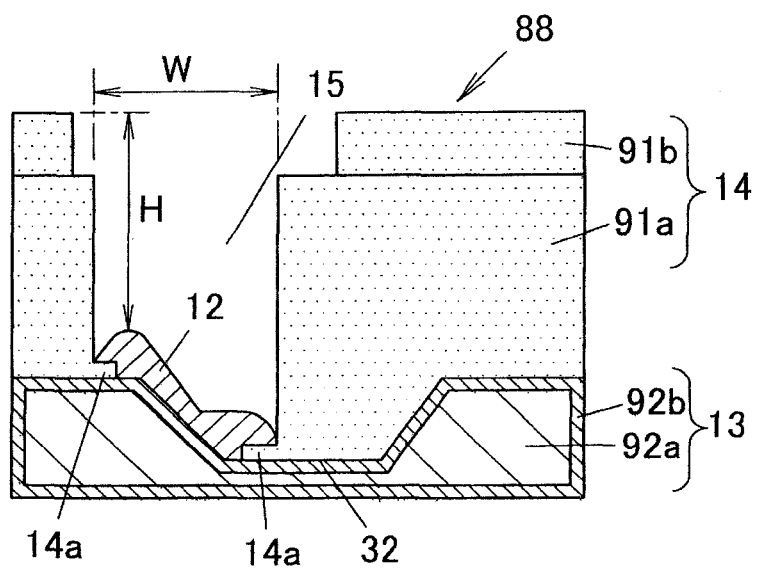

In the mold 85 depicted in FIG. 27A, a recess 32 is formed on an upper surface of a conductive base material 13, an insulating layer 14 is formed so as to enter part of the recess 32, and an insulating layer 14a protrudes on the bottom surface of the cavity 15. In the mold 86 depicted in FIG. 27B, the insulating layer 14 further has a two-layer structure of insulating layers 91a and 91b. In the molds 87 and 88 depicted in FIGS. 28A and 28B, a conductive base material 13 obtained by coating the surface of a core material 92a made of a non-conductive material (an insulating material) with a conductive coat part 92b made of a conductive material is further used.

As a mold for use in one or more embodiments of the present invention, any of those of various shapes and structures can be used. In any mold, the head-space height H and the cavity width W are defined as follows. For example, as depicted FIGS. 23A and 23B and 24A to 24D, the head-space height is a vertical distance from the highest position of the fabricated metal-formed product 12 to the height of the upper opening of the cavity 15 (that is, a plane where the upper surface of the insulating layer is positioned). However, when the upper surface of the insulating layer 14 is varied in height, as depicted in FIGS. 13A and 13B, the head-space height is defined as a vertical distance to an upper surface of the insulating layer 14 at a lowest position. Also, the cavity width W is a width of the cavity 15 at a height where the upper surface of the metal-formed product 12 is positioned.

DESCRIPTION OF REFERENCE NUMERALS 11, 31, 41, 51, 61, 71-88 mold
12 metal-formed product
13 conductive base material
14, 14a insulating layer
15 cavity
18 metal layer
19 electrolytic bath
21 counter electrode
32 recess
42a, 42b, 42c flat part
43a, 43b inclined surface part
52 step part While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An electroforming method comprising:
  a mold forming step of forming an insulating layer wherein the insulating layer is placed on an upper surface of a conductive base material;
  providing a recessed part in the insulating layer;
  forming a mold with the conductive base material exposed from at least part of a bottom surface of the recessed part, wherein the bottom surface of the recessed part is the lowest part of the recessed part;
  an electrodepositing step of applying a voltage to the mold disposed in an electrolytic bath;
  electrodepositing a metal on an exposed surface of the conductive base material inside the recessed part, and
  separating the metal layer from the mold
  wherein during the electrodepositing step, the recessed part has a width (W) equal to or longer than 300 μm, a metal layer is grown inside the recessed part to a final thickness until a space left above the metal layer has a height that is greater than or equal to W/2.85,
    wherein the space is between an upper surface of the electrodeposited metal layer and an upper edge of the recessed part, and
  wherein in the mold forming step, the insulating layer extends inward from the bottom surface of the recessed part to cover only a part of the bottom surface of the recessed part.

2. The electroforming method according to claim 1, wherein a recess is formed in the upper surface of the conductive base material in a region overlapping the bottom surface of the recessed part.

3. The electroforming method according to claim 1, wherein a surface of the conductive base material exposed from the bottom surface of the recessed part is a set configured of mainly a plane at an angle of inclination equal to or smaller than 60 degrees with respect to a plane perpendicular to a voltage applying direction.

4. The electroforming method according to claim 1, wherein in the mold forming step, a step part is formed on a side wall surface of the recessed part to expand an opening area of the recessed part.

5. The electroforming method according to claim 1, wherein in the electrodepositing step, the voltage is stopped when a total amount of passage of an electric current flowing through the electrolytic bath reaches a predetermined value.

6. An electroforming method comprising:
  a mold forming step of forming an insulating layer wherein the insulating layer is placed on an upper surface of a conductive base material;
  providing a recessed part in the insulating layer;
  forming a mold with the conductive base material exposed from at least part of a bottom surface of the recessed part, wherein the bottom surface of the recessed part is the lowest part of the recessed part;
  an electrodepositing step of applying a voltage to the mold disposed in an electrolytic bath;
  electrodepositing a metal on an exposed surface of the conductive base material inside the recessed part and,
  separating the metal layer from the mold wherein during the electrodepositing step, the recessed part has a width (W) equal to or longer than 200 μm and shorter than 300 μm, a metal layer is grown inside the recessed part to a final thickness until a space left above the metal layer has a height that is greater than or equal to W/3.75,
    wherein the space is between an upper surface of the electrodeposited metal layer and an upper edge of the recessed part, and
  wherein in the mold forming step, the insulating layer extends inward from the bottom surface of the recessed part to cover only a part of the bottom surface of the recessed part.

7. The electroforming method according to claim 6, wherein a recess is formed in the upper surface of the conductive base material in a region overlapping the bottom surface of the recessed part.

8. The electroforming method according to claim 6, wherein a surface of the conductive base material exposed from the bottom surface of the recessed part is a set configured of mainly a plane at an angle of inclination equal to or smaller than 60 degrees with respect to a plane perpendicular to a voltage applying direction.

9. The electroforming method according to claim 6, wherein in the mold forming step, a step part is formed on a side wall surface of the recessed part to expand an opening area of the recessed part.

10. The electroforming method according to claim 6, wherein in the electrodepositing step, the voltage is stopped when a total amount of passage of an electric current flowing through the electrolytic bath reaches a predetermined value.

11. An electroforming method comprising:
  a mold forming step of forming an insulating layer wherein the insulating layer is placed on an upper surface of a conductive base material;
  providing a recessed part in the insulating layer;
  forming a mold with the conductive base material exposed from at least part of a bottom surface of the recessed part, wherein the bottom surface of the recessed part is the lowest part of the recessed part;
  an electrodepositing step of applying a voltage to the mold disposed in an electrolytic bath;
  electrodepositing a metal on an exposed surface of the conductive base material inside the recessed part and,
  separating the metal layer from the mold
  wherein during the electrodepositing step, the recessed part has a width (W) equal to or longer than 100 μm and shorter than 200 μm, a metal layer is grown inside the recessed part to a final thickness until a space left above the metal layer has a height that is greater than or equal to W/4,
    wherein the space is between an upper surface of the electrodeposited metal layer and an upper edge of the recessed part, and
  wherein in the mold forming step, the insulating layer extends inward from the bottom surface of the recessed part to cover only a part of the bottom surface of the recessed part.

12. The electroforming method according to claim 11, wherein a recess is formed in the upper surface of the conductive base material in a region overlapping the bottom surface of the recessed part.

13. The electroforming method according to claim 11, wherein a surface of the conductive base material exposed from the bottom surface of the recessed part is a set configured of mainly a plane at an angle of inclination equal to or smaller than 60 degrees with respect to a plane perpendicular to a voltage applying direction.

14. The electroforming method according to claim 11, wherein in the mold forming step, a step part is formed on a side wall surface of the recessed part to expand an opening area of the recessed part.

15. The electroforming method according to claim 11, wherein in the electrodepositing step, the voltage is stopped when a total amount of passage of an electric current flowing through the electrolytic bath reaches a predetermined value.

16. An electroforming method comprising:
  a mold forming step of forming an insulating layer wherein the insulating layer is placed on an upper surface of a conductive base material;
  providing a recessed part in the insulating layer;
  forming a mold with the conductive base material exposed from at least part of a bottom surface of the recessed part, wherein the bottom surface of the recessed part is the lowest part of the recessed part;
  an electrodepositing step of applying a voltage to the mold disposed in an electrolytic bath;
  electrodepositing a metal on an exposed surface of the conductive base material inside the recessed part and,
  separating the metal layer from the mold
  wherein during the electrodepositing step, the recessed part has a width (W) shorter than 100 μm, a metal layer is grown inside the recessed part to a final thickness until a space left above the metal layer has a height that is greater than or equal to W/10,
    wherein the space is between an upper surface of the electrodeposited metal layer and an upper edge of the recessed part, and
  wherein in the mold forming step, the insulating layer extends inward from the bottom surface of the recessed part to cover only a part of the bottom surface of the recessed part.

17. The electroforming method according to claim 16, wherein a recess is formed in the upper surface of the conductive base material in a region overlapping the bottom surface of the recessed part.

18. The electroforming method according to claim 16, wherein a surface of the conductive base material exposed from the bottom surface of the recessed part is a set configured of mainly a plane at an angle of inclination equal to or smaller than 60 degrees with respect to a plane perpendicular to a voltage applying direction.

19. The electroforming method according to claim 16, wherein in the mold forming step, a step part is formed on a side wall surface of the recessed part to expand an opening area of the recessed part.

20. The electroforming method according to claim 16, wherein in the electrodepositing step, the voltage is stopped when a total amount of passage of an electric current flowing through the electrolytic bath reaches a predetermined value.

* * * * *